(12) United States Patent
Mizutani et al.

(10) Patent No.: US 6,743,565 B2
(45) Date of Patent: Jun. 1, 2004

(54) POSITIVE RESIST COMPOSITION WITH (BIS-TRI FLUOROMETHYL) METHYL SUBSTITUTED STYRENE

(75) Inventors: Kazuyoshi Mizutani, Shizuoka (JP); Toru Fujimori, Shizuoka (JP); Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 178 days.

(21) Appl. No.: 10/156,227

(22) Filed: May 29, 2002

(65) Prior Publication Data

US 2003/0108811 A1 Jun. 12, 2003

(30) Foreign Application Priority Data

May 31, 2001 (JP) .................................... P. 2001-164760

(51) Int. Cl.$^7$ ............................................... G03F 7/039
(52) U.S. Cl. ..................... 430/270.1; 430/907; 430/914
(58) Field of Search .............................. 430/270.1, 914, 430/907

(56) References Cited

U.S. PATENT DOCUMENTS

| 6,207,343 | B1 | | 3/2001 | Fujimori et al. | |
|---|---|---|---|---|---|
| 6,610,456 | B2 | * | 8/2003 | Allen et al. | 430/907 |
| 2002/0061464 | A1 | * | 5/2002 | Aoai et al. | 430/914 |
| 2002/0160297 | A1 | * | 10/2002 | Fedynyshyn et al. | 430/270.1 |
| 2002/0168584 | A1 | * | 11/2002 | Aoai et al. | 430/270.1 |

FOREIGN PATENT DOCUMENTS

| DE | 42 07 261 C2 | 9/1993 |
|---|---|---|
| DE | 42 07 264 A1 | 9/1993 |
| WO | WO 00/17712 A1 | 3/2000 |

\* cited by examiner

*Primary Examiner*—Richard L. Schilling
(74) *Attorney, Agent, or Firm*—Sughrue Mion, PLLC

(57) ABSTRACT

A positive resist composition is disclosed, comprising (A) a resin containing at least one repeating unit represented by the following formula (I) and at least one repeating unit represented by formula (VII), which decomposes under the action of an acid to increase the solubility in an alkali developer, and (B) a compound capable of generating an acid upon irradiation with actinic rays or radiation.

16 Claims, No Drawings

POSITIVE RESIST COMPOSITION WITH (BIS-TRI FLUOROMETHYL) METHYL SUBSTITUTED STYRENE

FIELD OF THE INVENTION

The present invention relates to a positive resist composition (i.e., a positive-working positive resist composition) which is suitably used for the microlithography process at the production of VLSI (super LSI) or high-capacity microchip, or other photo-fabrication processes. More specifically, the present invention relates to a positive resist composition capable of forming a highly accurate pattern using vacuum ultraviolet light of 160 nm or less.

BACKGROUND OF THE INVENTION

The integration degree of integrated circuits is recently more and more increasing and in the production of a semiconductor substrate of VLSI or the like, an ultrafine pattern comprising lines having a width of quarter-micron or less must be processed. According to one known technique for achieving refinement of a pattern, a resist pattern is formed using an exposure light source having a shorter wavelength. This technique can be described using the following Rayleigh's formula showing the resolution (line width) R of an optical system:

$$R = k \cdot \lambda / NA$$

(wherein $\lambda$ is a wavelength of the exposure light source, NA is a numerical aperture of the lens and k is a process constant). As seen from this formula, a higher resolution, namely, a smaller R value can be obtained by reducing the wavelength $\lambda$ of the exposure light source.

For example, in the production of a semiconductor device having an integration degree up to 64 M bits, the i-line (365 nm) of a high-pressure mercury lamp is used at present as the light source. As for the positive resist capable of coping with this light source, a large number of compositions containing a novolak resin and a naphthoquinonediazide compound as the photosensitive material have been developed and these compositions are satisfactorily effective in the process of a line width up to about 0.3 μm. In the production of a semiconductor device having an integration degree of 256 M bits or more, a KrF excimer laser (248 nm) is used as the exposure light source in place of the i-line.

Furthermore, with an attempt to produce a semiconductor device having an integration degree of 1 G bits or more, use of an ArF excimer laser (193 nm) and for forming a pattern of 0.1 μm or less, use of an $F_2$ excimer laser (157 nm), which are a light source having a further shorter wavelength, are being studied.

In order to keep up with these light sources having a shorter wavelength, the constituent components of the resist material and the compound structure thereof are greatly changed. More specifically, the conventional resist containing a novolak resin and a naphthoquinone-diazide compound has a large absorption in the far ultraviolet region of 248 nm and light of sufficiently high intensity cannot reach the resist bottom, as a result, only a low-sensitive and tapered pattern can be obtained.

For solving this problem, a so-called chemical amplification-type resist has been developed. This is a composition mainly comprising a resin which has a basic skeleton of poly(hydroxystyrene) having small absorption in the region of 248 nm and is protected by an acid decomposable group, where a compound capable of generating an acid upon irradiation of far ultraviolet light (acid generator) is used in combination. The chemical amplification-type resist changes the solubility in a developer by the catalytic decomposition reaction of an acid generated in the exposed area and therefore, a high-sensitivity and high-resolution pattern can be formed.

The acid decomposable resin and the acid generator which can be effectively used in the chemical amplification-type resist are described in a large number of papers and patents such as *Polym. Eng. Sci.*, Vol. 23, page 1012 (1983), *ACS. Sym.*, Vol. 242, page 11 (1984), *Macromolecules*, Vol. 21, page 1475 (1988), *Yuki Gosei Kagaku Kyokai Shi* (*Journal of Organic Synthesis Chemistry Society*), Vol. 49, page 437 (1991), *Bisai Kako to Resist* (*Fine Working and Resist*), Kyoritsu Shuppan (1987). In the case of using ArF excimer laser light (193 nm), since the compound having an aromatic group substantially has large absorption in the wavelength region of 193 nm, even the above-described chemical amplification-type resist cannot provide a sufficiently high performance.

In order to solve this problem, the chemical amplification-type resist is improved by using an acid decomposable resin where an alicyclic structure having no absorption at 193 nm is introduced into the main or side chain of the polymer, in place of the acid decomposable resin having a basic skeleton of poly(hydroxystyrene).

This alicyclic structure-type acid decomposable resin is described, for example, in JP-A-4-39665 (the term "JP-A" as used herein means an "unexamined published Japanese patent application), JP-A-7-234511, JP-A-9-73173, JP-A-7-199467, JP-A-8-259626, JP-A-9-221519, JP-A-10-10739, JP-A-9-230595, JP-A-10-111569, JP-A-10-218947, JP-A-10-153864 and WO-97/33198.

It is, however, found that even this alicyclic structure-type resin has large absorption in the region of 157 nm and with an $F_2$ excimer laser light (157 nm), the objective pattern of 0.1 μm or less cannot be obtained. On the other hand, a resin where a fluorine atom (perfluoro structure) is introduced is reported to have high transparency to light at 157 nm (see, *Proc. SPIE.*, Vol. 3678, page 13 (1999)) and the structures of effective fluororesins are described in *Proc. SPIE.*, Vol. 3999, page 330 (2000), ibid., page 357 (2000), ibid., page 365 (2000) and WO-00/17712.

However, these resists having fluororesin are not sufficiently high in the dry etching resistance and also, due to their peculiar water repellency or oil repellency ascribable to the perfluoro structure, the coatability (uniformity of the coated surface) is in need of improvement. Furthermore, reduction in the development defect is demanded.

SUMMARY OF THE INVENTION

Accordingly, an object of the present invention is to provide a positive(-working) resist composition suitable for use with an exposure light source of 160 nm or less, particularly, $F_2$ excimer laser light (157 nm). More specifically, the object of the present invention is to provide a positive(-working) resist composition capable of exhibiting sufficiently high transparency on use of a light source of 157 nm and also satisfying the requirements in regard to the coatability and development defect.

Another object of the present invention is to provide a positive(-working) resist composition capable of forming a pattern with good sensitivity and high resolution and exhibiting excellent dry etching resistance.

As a result of extensive investigations by taking notice of various properties described above, the present inventors have found that the objects of the present invention can be attained by the use of the following specific composition. The present invention has been accomplished based on this finding.

More specifically, the present invention has the following constructions.

(1) A positive resist composition comprising (A) a resin containing at least one repeating unit represented by the following formula (I) and at least one repeating unit represented by formula (VII), which decomposes under the action of an acid to increase the solubility in an alkali developer, and (B) a compound capable of generating an acid upon irradiation with actinic rays or radiation:

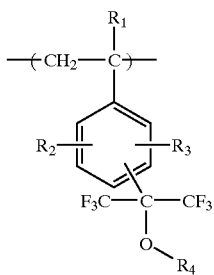
(I)

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; and $R_4$ represents a hydrogen atom, an alkyl group which may have a substituent, a perfluoroalkyl group which may have a substituent, a cycloalkyl group which may have a substituent, an acyl group which may have a substituent, an alkoxycarbonyl group which may have a substituent, an alkoxycarbonylmethyl group which may have a substituent, or a group represented by formula (II) which may have a substituent:

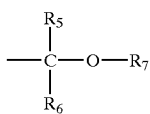
(II)

wherein $R_5$ and $R_6$, which may be the same or different, each represents a hydrogen atom, an alkyl group which may have a substituent, or a cycloalkyl group which may have a substituent; $R_7$ represents an alkyl group which may have a substituent, a perfluoroalkyl group which may have a substituent, a cycloalkyl group which may have a substituent, a perfluorocycloalkyl group which may have a substituent, an aralkyl group which may have a substituent, or an aryl group which may have a substituent; and two of $R_5$ to $R_7$ may combine to form a ring;

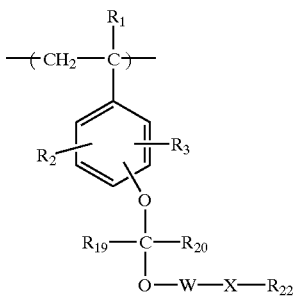
(VII)

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; $R_{19}$ and $R_{20}$, which may be the same or different, each represents an alkyl group which may have a substituent, a monocyclic or polycyclic cycloalkyl group which may have a substituent, an alkenyl group which may have a substituent, an aralkyl group which may have a substituent, or an aryl group which may have a substituent; W represents a divalent linking group; X represents a single bond, an oxygen atom, a sulfur atom, a selenium atom, or a group selected from the group consisting of —CO—, —CO$_2$—, —OCO—, —SO— and —SO$_2$—; and $R_{22}$ represents a monovalent hydrocarbon group having from 1 to 30 carbon atoms, which may have a heteroatom.

(2) The positive resist composition as described in (1) above, wherein the resin (A) further contains at least one repeating unit represented by the following formula (VI):

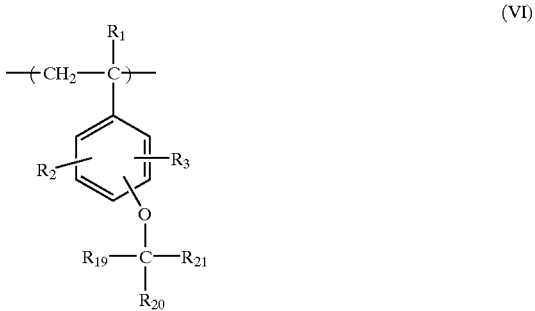
(VI)

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; $R_{19}$ to $R_{21}$, which may be the same or different, each represents an alkyl group which may have a substituent, a monocyclic or polycyclic cycloalkyl group which may have a substituent, an alkenyl group which may have a substituent, an aralkyl group which may have a substituent, or an aryl group which may have a substituent; and two of $R_{19}$ to $R_{21}$ may combine to form a ring.

(3) The positive resist composition as described in (1) or (2) above, wherein the resin (A) further contains at least one repeating unit represented by the following formula (III):

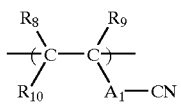
(III)

wherein $R_8$ and $R_9$, which may be the same or different, each represents a hydrogen atom, a halogen atom, a cyano group, an alkyl group which may have a substituent, or a haloalkyl group which may have a substituent; $R_{10}$ represents a hydrogen atom, a halogen atom, an alkyl group which may have a substituent, a haloalkyl group which may have a substituent, or a —$A_1$—CN group; $A_1$ represents a single bond, a divalent alkylene group which may have a substituent, an alkenylene group which may have a substituent, a cycloalkylene group which may have a substituent, an arylene group which may have a substituent, —O—CO—$R_{11}$—, —CO—O—$R_{12}$— or —CO—N($R_{13}$)—$R_{14}$—; $R_{11}$, $R_{12}$ and $R_{14}$, which may be the same or different, each represents a single bond, a divalent alkylene group which may have an ether group, an ester group, an amido group, a urethane group or a ureido group, an alkenylene group which may have an ether group, an ester group, an amido group, a urethane group or a ureido group, a cycloalkylene group which may have an ether group, an ester group, an amido group, a urethane group or a ureido group, or an arylene group which may have an ether group, an ester group, an amido group, a urethane group or a ureido group; and $R_{13}$ represents a hydrogen atom, an alkyl group which may have a substituent, a cycloalkyl group which may have a substituent, an aralkyl group which may have a substituent, or an aryl group which may have a substituent.

(4) The positive resist composition as described in any one of (1) to (3) above, which further contains (C) a compound having a basic nitrogen atom as the acid diffusion inhibitor.

(5) The positive resist composition as described in any one of (1) to (4) above, wherein the compound as the component (B) is selected from sulfonium salt or iodonium salt compounds capable of generating a perfluoro-alkylsulfonic acid having 2 or more carbon atoms, a perfluoroarylsulfonic acid or an arylsulfonic acid substituted by a perfluoroalkyl group upon irradiation with actinic rays or radiation.

(6) The positive resist composition as described in any one of (1) to (5) above, wherein the compound as the component (B) is selected from an imido-N-sulfonate compound, an oxime-N-sulfonate compound or a disulfone compound.

(7) The positive resist composition as described in any one of (1) to (6) above, which further contains (D) a fluorine-containing surfactant and/or a silicon-containing surfactant.

(8) The positive resist composition as described in any one of (1) to (7) above, wherein vacuum ultraviolet light of 160 nm or less is used as an exposure light source.

(9) The positive resist composition as described in any one of (1) to (8) above, wherein the compound as the component (B) comprises sulfonium salt or iodonium salt compounds capable of generating a perfluoroalkyl-sulfonic acid having 2 or more carbon atoms, a perfluoroarylsulfonic acid or an arylsulfonic acid substituted by a perfluoroalkyl group; and an imido-N-sulfonate compound, an oxime-N-sulfonate compound or a disulfone compound.

(10) The positive resist composition as described in (5) above, wherein the sulfonium salt is a compound generating a nanofluorobutanesulfonic acid.

DETAILED DESCRIPTION OF THE INVENTION

The components for use in the present invention are described in detail below.

[1] Resin (A)

The resin (A) for use in the present invention is a resin containing at least one repeating unit represented by formula (I) and at least one repeating unit represented by formula (VII), which decomposes under the action of an acid to increase the solubility in an alkali developer.

In formulae, each $R_1$ represents a hydrogen atom, a halogen atom, a cyano group, an alkyl group which may have a substituent, or a haloalkyl group which may have a substituent. $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent.

$R_4$ represents a hydrogen atom, an alkyl group which may have a substituent, a perfluoroalkyl group which may have a substituent, a monocyclic or polycyclic cycloalkyl group which may have a substituent, an acyl group which may have a substituent, an alkoxycarbonyl group which may have a substituent, an alkoxycarbonylmethyl group which may have a substituent, or a group represented by formula (II) which may have a substituent, and preferably a hydrogen atom.

$R_5$ and $R_6$, which may be the same or different, each represents a hydrogen atom, an alkyl group which may have a substituent, or a cycloalkyl group which may have a substituent. $R_7$ represents an alkyl group which may have a substituent, a perfluoroalkyl group which may have a substituent, a cycloalkyl group which may have a substituent, a perfluorocycloalkyl group which may have a substituent, an aralkyl group which may have a substituent, or an aryl group which may have a substituent. Two of $R_5$ to $R_7$ may combine to form a ring.

$R_8$ and $R_9$, which may be the same or different, each represents a hydrogen atom, a halogen atom, a cyano group, an alkyl group which may have a substituent, or a haloalkyl group which may have a substituent. $R_{10}$ represents a hydrogen atom, a halogen atom, an alkyl group which may have a substituent, a haloalkyl group which may have a substituent, or a —$A_1$—CN group.

$A_1$ represents a single bond, a divalent alkylene group which may have a substituent, an alkenylene group which may have a substituent, a cycloalkylene group which may have a substituent, an arylene group which may have a substituent, —O—CO—$R_{11}$—, —CO—O—$R_{12}$— or —CO—N($R_{13}$)—$R_{14}$—.

$R_{11}$, $R_{12}$ and $R_{14}$, which may be the same or different, each represents a single bond, a divalent alkylene group which may have an ether group, an ester group, an amido group, a urethane group or a ureido group, an alkenylene group which may have an ether group, an ester group, an amido group, a urethane group or a ureido group, a cycloalkylene group which may have an ether group, an ester group, an amido group, a urethane group or a ureido group, or an arylene group which may have an ether group, an ester group, an amido group, a urethane group or a ureido group. $R_{13}$ represents a hydrogen atom, an alkyl group which may have a substituent, a cycloalkyl group which may have a substituent, an aralkyl group which may have a substituent, or an aryl group which may have a substituent.

$R_{19}$, $R_{20}$ and $R_{21}$, which may be the same or different, each represents an alkyl group which may have a substituent, a monocyclic or polycyclic cycloalkyl group which may have a substituent, an alkenyl group which may have a substituent, an aralkyl group which may have a substituent, or an aryl group which may have a substituent. Two of $R_{19}$ to $R_{21}$ may combine to form a ring. W represents a divalent linking group. X represents a single bond, an oxygen atom, a sulfur atom, a selenium atom, or a group selected from the group consisting of —CO—, —CO$_2$—, —OCO—, —SO— and —SO$_2$—. $R_{22}$ represents a monovalent hydrocarbon group having from 1 to 30 carbon atoms, which may have a heteroatom.

Examples of the alkyl group include an alkyl group having from 1 to 8 carbon atoms and specifically, preferred examples thereof include a methyl group, an ethyl group, a propyl group, an n-butyl group, a sec-butyl group, a hexyl group, a 2-ethylhexyl group and an octyl group. The cycloalkyl group may be a monocyclic type or a polycyclic type. The monocyclic type is a cycloalkyl group having from 3 to 8 carbon atoms and preferred examples thereof include a cyclopropyl group, a cyclopentyl group, a cyclohexyl group, a cycloheptyl group and a cyclooctyl group. The polycyclic type is a cycloalkyl group having from 6 to 20 carbon atoms and preferred examples thereof include an adamantyl group, a norbornyl group, an isoboronyl group, a camphanyl group, a dicyclopentyl group, an a-pinel group, a tricyclodecanyl group, a tetracyclo-dodecyl group and an androstanyl group.

Examples of the perfluoroalkyl group include a perfluoroalkyl group having from 1 to 12 carbon atoms and specifically, preferred examples thereof include a trifluoromethyl group, a pentafluoroethyl group, a 2,2,2-trifluoroethyl group, a heptafluoropropyl group, a 2,2,3,3,3-pentafluoro-1-propyl group, a 2,2,3,4,4,4-hexafluoro-1-butyl group, a 2,2,3,3,4,4,4-heptafluoro-1-butyl group, a 2,2,3,3,4,4,5,5-octafluoro-1-pentyl group, a perfluorobutyl group, a perfluorohexyl group, a perfluorohexylethyl group, a perfluoroheptylmethyl group, a perfluorooctyl group, a perfluorooctylethyl group and a perfluorodecylethyl group.

The perfluorocycloalkyl group is a monocyclic or polycyclic cycloalkyl group substituted by a plurality of fluorine groups. The monocyclic type is a perfluoro-cycloalkyl group having from 3 to 8 carbon atoms and preferred examples thereof include a perfluorocyclopropyl group, a perfluorocyclopentyl group and a perfluoro-cyclohexyl group. The polycyclic type is a perfluoro-cycloalkyl group having from 6 to 20 carbon atoms and preferred examples thereof include a perfluoroadamantyl group, a perfluoronorbornyl group, a perfluoroisoboronyl group, a perfluorotricyclodecanyl group and a perfluoro-tetracyclododecyl group. Examples of the haloalkyl group include a haloalkyl group having from 1 to 4 carbon atoms and specifically, preferred examples thereof include a chloromethyl group, a chloroethyl group, a chloropropyl group, a chlorobutyl group, a bromomethyl group and a bromoethyl group.

Examples of the aryl group include an aryl group having from 6 to 15 carbon atoms and specifically, preferred examples thereof include a phenyl group, a tolyl group, a dimethylphenyl group, a 2,4,6-trimethylphenyl group, a naphthyl group, an anthryl group and a 9,10-dimethoxyanthryl group. Examples of the aralkyl group include an aralkyl group having from 7 to 12 carbon atoms and specifically, preferred examples thereof include a benzyl group, a phenethyl group and a naphthylmethyl group.

Examples of the alkenyl group include an alkenyl group having from 2 to 8 carbon atoms and specifically, preferred examples thereof include a vinyl group, an allyl group, a butenyl group and a cyclohexenyl group. Examples of the alkoxy group include an alkoxy group having from 1 to 8 carbon atoms and specifically, preferred examples thereof include a methoxy group, an ethoxy group, an n-propoxy group, an iso-propoxy group, a butoxy group, a pentoxy group, an allyloxy group and an octoxy group.

Examples of the acyl group include an acyl group having from 1 to 10 carbon atoms and specifically, preferred examples thereof include a formyl group, an acetyl group, a propanoyl group, a butanoyl group, a pivaloyl group, an octanoyl group and a benzoyl group. Examples of the alkoxycarbonyl group include a tertiary alkoxycarbonyl group such as t-butoxycarbonyl group, t-amyloxycarbonyl group and 1-methyl-1-cyclohexyloxycarbonyl group. Examples of the alkoxycarbonylmethyl group include a tertiary alkoxycarbonylmethyl group such as t-butoxycarbonylmethyl group, t-amyloxycarbonylmethyl group and 1-methyl-1-cyclohexyloxycarbonylmethyl group.

Preferred examples of the alkylene group include an alkylene group having from 1 to 8 carbon atoms, such as methylene group, ethylene group, propylene group, butylene group, hexylene group and octylene group, which groups each may have a substituent. Preferred examples of the alkenylene group include an alkenylene group having from 2 to 6 carbon atoms, such as ethenylene group, propenylene group and butenylene group, which groups each may have a substituent. Preferred examples of the cycloalkylene group include a cycloalkylene group having from 5 to 8 carbon atoms, such as cyclopentylene group and cyclohexylene group, which groups each may have a substituent. Preferred examples of the arylene group include an arylene group having from 6 to 15 carbon atoms, such as phenylene group, tolylene group and naphthylene group, which groups each may have a substituent.

Preferred examples of the divalent linking group represented by W include a linear, branched or cyclic alkylene group which may have a substituent, an arylene group which may have a substituent, a heteroarylene group which may have a substituent, an aralkylene group which may have a substituent, —S—, —CO—, —N(R$_4$)—, —SO—, —SO$_2$—, —COO—, —N(R$_4$)SO$_2$— (wherein R$_4$ represents a hydrogen atom or an alkyl group having from 1 to 4 carbon atoms) or a divalent group formed by combining two or more of these groups. Examples of the alkyl group represented by R$_4$ include an alkyl group having from 1 to 4 carbon atoms, such as methyl group, ethyl group, n-propyl group, isopropyl group, n-butyl group, isobutyl group, sec-butyl group and t-butyl group.

Specific examples of W include a methylene group, an ethylene group, a propylene group, a butylene group, a pentylene group, a hexylene group, a heptylene group, an octylene group, a phenylene group, a naphthylene group, an anthrylene group, a biphenylene group, a phenylmethylene group, a phenylethylene group, —S—, —CO—, —N(CH$_3$)——N(C$_2$H$_5$)—, —SO—, —SO$_2$—, —COO—, —NHSO$_2$— and —N(CH$_3$)SO$_2$—.

Examples of the monovalent hydrocarbon group having from 1 to 30 carbon atoms, represented by $R_{22}$ include a linear, branched or cyclic alkyl group which may have a substituent, an aryl group which may have a substituent and an aralkyl group which may have a substituent.

Examples of the linear or branched alkyl group represented by $R_{22}$ include a methyl group, an ethyl group, an n-propyl group, an i-propyl group, an n-butyl group, an i-butyl group, a t-butyl group, an n-pentyl group, an i-pentyl group, a t-pentyl group, an n-hexyl group, an i-hexyl group, a t-hexyl group, an n-heptyl group, an i-heptyl group, a t-heptyl group, an n-octyl group, an i-octyl group, a t-octyl group, an n-nonyl group, an i-nonyl group, a t-nonyl group, an n-decanyl group, an i-decanyl group, a t-decanyl group, an n-undecyl group, an i-undecyl group, an n-dodecyl group, an i-dodecyl group, an n-tridecyl group, an i-tridecyl group, an n-tetradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, an n-nonadecyl group and an i-nonadecyl group.

The cyclic alkyl group represented by $R_{22}$ may be a cyclic alkyl group having a substituent and examples thereof include a cyclopropyl group, a cyclobutyl group, a cyclopentyl group, a cyclohexyl group, a cycloheptyl group, a cyclooctyl group, a cyclononyl group, a cyclodecanyl group, a cycloundecyl group, a cyclododecyl group, a cyclotridecyl group, a cyclotetradecyl group, a cyclopentadecyl group, a cyclohexadecyl group, a cycloheptadecyl group, a cyclooctadecyl group, a cyclononadecyl group, a 4-cyclohexylcyclohexyl group, a 4-n-hexylcyclohexyl group, a pentanylcyclohexyl group, a hexyloxycyclohexyl group and a pentanyloxycyclohexyl group.

Examples of the aryl group which may have a substituent, represented by $R_{22}$ include a phenyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 3-n-propylphenyl group, a 2-n-propylphenyl group, a 4-1-propylphenyl group, a 3-i-propylphenyl group, a 2-1-propylphenyl group, a 4-cyclopropylphenyl group, a 3-cyclopropylphenyl group, a 2-cyclopropylphenyl group, a 4-n-butylphenyl group, a 3-n-butylphenyl group, a 2-n-butylphenyl group, a 4-i-butylphenyl group, a 3-1-butylphenyl group, a 2-i-butylphenyl group, a 4-t-butylphenyl group, a 3-t-butylphenyl group, a 2-t-butylphenyl group, a 4-cyclobutylphenyl group, a 3-cyclobutylphenyl group, a 2-cyclobutylphenyl group, a 4-cyclopentylphenyl group, a 4-cyclohexylphenyl group, a 4-cycloheptenylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyl-oxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-di-isopropylphenyl group, a 2,3-di-isopropylphenyl group, a 2,4-di-isopropylphenyl group, a 3,4-di-isopropylphenyl group, a 3,6-di-t-butylphenyl group, a 2,3-di-t-butylphenyl group, a 2,4-di-t-butylphenyl group, a 3,4-di-t-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-t-amylphenyl group, a 2,3-di-t-amylphenyl group, a 2,4-di-t-amylphenyl group, a 3,4-di-t-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronylphenyl group, a 3-isoboronylphenyl group, a 2-isoboronylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxy-phenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropyloxy-phenyl group, a 2,4-di-isopropyloxyphenyl group, a 3,4-di-isopropyloxyphenyl group, a 2,6-di-t-butyloxyphenyl group, a 2,3-di-t-butyloxyphenyl group, a 2,4-di-t-butyloxyphenyl group, a 3,4-di-t-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-1-butyloxyphenyl group, a 2,4-di-i-butyloxyphenyl group, a 3,4-di-i-butyloxyphenyl group, a 2,6-di-t-amyloxyphenyl group, a 2,3-di-t-amyloxyphenyl group, a 2,4-di-t-amyloxyphenyl group, a 3,4-di-t-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxy-phenyl group and 2-isoboronyloxyphenyl group. These groups each may be further substituted within the above-described range of the carbon atom number and the substituent is not limited to the substituents other than those described above.

Examples of the aralkyl group represented by $R_{22}$ include a phenylethyl group, a 4-methylphenylethyl group, a 3-methylphenylethyl group, a 2-methylphenylethyl group, a 4-ethylphenylethyl group, a 3-ethylphenylethyl group, a 2-ethylphenylethyl group, a 4-n-propylphenylethyl group, a 3-n-propylphenylethyl group, a 2-n-propylphenylethyl group, a 4-i-propylphenylethyl group, a 3-i-propylphenylethyl group, a 2-i-propylphenylethyl group, a 4-cyclopropylphenylethyl group, a 3-cyclopropylphenylethyl group, a 2-cyclopropylphenylethyl group, a 4-n-butylphenylethyl group, a 3-n-butylphenylethyl group, a 2-n-butylphenylethyl group, a 4-i-butylphenylethyl group, a 3-i-butylphenylethyl group, a 2-i-butylphenylethyl group, a 4-t-butylphenylethyl group, a 3-t-butylphenylethyl group, a 2-t-butylphenylethyl group, a 4-cyclobutylphenylethyl group, a 3-cyclobutylphenylethyl group, a 2-cyclobutylphenylethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, a 2-cycloheptenylphenylethyl group, a 2-cyclooctanylphenylethyl group, a 3-cyclopentylphenylethyl group, a 3-cyclohexylphenylethyl group, a 3-cycloheptenyl-phenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxy-phenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-t-butylphenylethyl group, a 2,3-di-t-butylphenylethyl group, a 2,4-di-t-butylphenylethyl group, a 3,4-di-t-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-1-butylphenylethyl group, a 2,3-di-i-butylphenylethyl group, a 2,4-di-i-butylphenylethyl group, a 3,4-di-i-butylphenylethyl group, a 2,6-di-t-amylphenylethyl group, a 2,3-di-t-amylphenylethyl group, a 2,4-di-t-amylphenylethyl group, a 3,4-di-t-amylphenylethyl group, a 2,6-di-i-amylphenylethyl group, a 2,3-di-i-amylphenylethyl group, a 2,4-di-i-amylphenylethyl group, a 3,4-di-i-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 3-adamantylphenylethyl group, a 2-adamantylphenylethyl group, a 4-isoboronylphenylethyl group, a 3-isoboronylphenylethyl group, a 2-isoboronylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxy-phenylethyl group, a 4-n-pentyloxyphenylethyl group, a 4-n-hexyloxyphenylethyl group, a 4-n-heptenyloxyphenylethyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, a 3-n-hexyloxyphenylethyl group, a 3-n-heptenyloxyphenylethyl group, a 3-n-octanyloxyphenylethyl group, a 2,6-di-isopropyloxyphenylethyl group, a 2,3-di-isopropyloxyphenylethyl group, a 2,4-di-isopropyloxyphenylethyl group, a 3,4-di-isopropyloxyphenylethyl group, a 2,6-di-t-butyloxyphenylethyl group, a 2,3-di-t-butyloxyphenylethyl group, a 2,4-di-t-butyloxyphenylethyl group, a 3,4-di-t-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenylethyl group, a 2,3-di-i-butyloxyphenylethyl group, a 2,4-di-i-butyloxyphenylethyl group, a 3,4-di-i-butyloxyphenylethyl group, a 2,6-di-t-amyloxyphenylethyl group, a 2,3-di-t-amyloxyphenylethyl group, a 2,4-di-t-amyloxyphenylethyl group, a 3,4-di-t-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl group, a 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isoboronyloxyphenylethyl group, a 3-isoboronyloxyphenylethyl group, 2-isoboronyloxyphenylethyl group and these groups where the alkyl is replaced by a methyl group, a propyl group, a butyl group or the like.

Examples of the substituent which is further substituted to the above-described groups include a hydroxyl group, a halogen atom (e.g., fluorine, chlorine, bromine, iodine), a nitro group, a cyano group, the above-described alkyl group, an alkoxy group (e.g., methoxy, ethoxy, hydroxyethoxy, propoxy, hydroxypropoxy, n-butoxy, isobutoxy, sec-butoxy, t-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an akenyloxy group (e.g., vinyloxy, propenyloxy, allyloxy, butenyloxy), the above-described aryl group, an aryloxy group (e.g., phenoxy) and an aryloxycarbonyl group (e.g., benzoyloxy).

$R_{22}$ is preferably an aryl group which may have a substituent, or an aralkyl group which may have a substituent, more preferably a 4-cyclohexylphenyl group, a 4-phenoxyphenyl group, a 4-(phenylcarbonyl)phenyl group, a naphthyl group or a 2-naphthalenesulfonyl group.

The heteroatom is preferably present on the way of the carbon—carbon bond of the monovalent hydrocarbon group having from 1 to 30 carbon atoms and examples thereof include —O—, —CO—, —S— and —CS—.

Examples of the ring formed by the combining of two of $R_5$ to $R_7$ or two of $R_{19}$ to $R_{21}$ include 3- to 8-membered rings and specific examples thereof include a cyclopropane ring, a cyclopentane ring, a cyclohexane ring, a furan ring, a pyran ring, a dioxonol ring, a 1,3-dioxolane ring. Z represents an atomic group for constituting a monocyclic or polycyclic alicyclic group. The monocyclic type is an alicyclic group having from 3 to 8 carbon atoms and preferred examples thereof include a cyclopropyl group, a cyclopentyl group, a cyclohexyl group, a cycloheptyl group and a cyclooctyl group. The polycyclic type is an alicyclic group having from 6 to 20 carbon atoms and examples thereof include an adamantyl group, a norbornyl group, an isoboronyl group, a camphanyl group, a dicyclopentyl group, an a-pinel group, a tricyclodecanyl group, a tetracyclododecyl group and an androstanyl group.

Examples of the substituent which is substituted to these groups include those having an active halogen, such as amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

The content of the repeating units represented by formulae (I) is from 40 to 80 mol % in the entire polymer composition.

The content of the repeating units represented by formulae (VII) is from 15 to 30 mol % in the entire polymer composition.

The total content of the repeating units represented by formulae (I) and (VII) is from 20 to 100 mol %, preferably from 30 to 80 mol %, more preferably from 40 to 70 mol %, in the entire polymer composition.

The content of the repeating unit represented by formula (VI) is from 0 to 40 mol %, preferably from 5 to 30 mol %, more preferably from 10 to 20 mol %, in the entire polymer composition.

The content of the repeating unit represented by formula (III) is from 0 to 80 mol %, preferably from 20 to 60 mol %, more preferably from 30 to 50 mol %, in the entire polymer composition.

In addition to these repeating units, other polymerizable monomers may also be copolymerized in the resin (A) so as to improve the performance of the positive resist of the present invention.

Examples of the copolymerizable monomer which can be used include compounds having one addition polymerizable unsaturated bond, selected from acrylic acid esters, acrylamides, methacrylic acid esters, methacrylamides, allyl compounds, vinyl ethers, vinyl esters, styrenes and crotonic acid esters other than those described above.

Specifically, examples thereof include acrylic acid esters such as alkyl (the alkyl group is preferably an alkyl group having from 1 to 10 carbon atoms) acrylates (e.g., methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate) and aryl acrylates (e.g., phenyl acrylate);

methacrylic acid esters such as alkyl (the alkyl group is preferably an alkyl group having from 1 to 10 carbon atoms) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylates (e.g., phenyl methacrylate, cresyl methacrylate, naphthyl methacrylate);

acrylamides such as acrylamide, N-alkylacrylamide (the alkyl group is an alkyl group having from 1 to 10 carbon atoms, such as methyl group, ethyl group, propyl group, butyl group, t-butyl group, heptyl group, octyl group, cyclohexyl group, benzyl group and hydroxyethyl group), N-arylacrylamide (the aryl group is, for example, a phenyl group, a tolyl group, a nitrophenyl group, a naphthyl group, a cyanophenyl group, a hydroxyphenyl group or a carboxyphenyl group), N,N-dialkylacrylamide (the alkyl group is an alkyl group having from 1 to 10 carbon atoms, such as methyl group, ethyl group, butyl group, isobutyl group, ethylhexyl group and cyclohexyl group), N-diarylacrylamide (the aryl group is for example, a phenyl group), N-methyl-N-phenylacrylamide, N-hydroxyethyl-N-methylacrylamide and N-2-acetamidoethyl-N-acetylacrylamide;

methacrylamides such as methacrylamide, N-alkylmethacrylamide (the alkyl group is an alkyl group having from 1 to 10 carbon atoms, such as methyl group, ethyl group, t-butyl group, ethylhexyl group, hydroxyethyl group and cyclohexyl group), N-arylmethacrylamide (the aryl group is, for example, a phenyl group), N,N-dialkylmethacrylamide (the alkyl group is, for example, an ethyl group, a propyl group or a butyl group), N,N-diarylmethacrylamide (the aryl group is, for example, a phenyl group), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ethers (e.g., vinyl phenyl ether, vinyl tolyl ether, vinyl chlorophenyl ether, vinyl-2,4-dichlorophenyl ether, vinyl naphthyl ether, vinyl anthranyl ether);

vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinylcyclohexyl carboxylate, vinyl benzoate, vinyl salicylate, vinyl chlorobenzoate, vinyl tetrachlorobenzoate and vinyl naphthoate;

styrenes such as styrene, alkylstyrenes (e.g., methylstyrene, dimethylstyrene, trimethylstyrene, ethyl-styrene, diethylstyrene, isopropylstyrrene, butylstyrene, hexylstyrene, cyclohexylstyrene, decylstyrene, benzyl-styrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogen styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrene and vinylnaphthalene;

crotonic acid esters such as alkyl crotonates (e.g., butyl crotonate, hexyl crotonate, glycerin monocrotonate); dialkyl itaconates (e.g., dimethyl itaconate, diethyl itaconate, dibutyl itaconate); and dialkyl esters of maleic acid or fumaric acid (e.g., dimethyl maleate, dibutyl fumarate).

Other than these, addition-polymerizable unsaturated compounds which can be generally copolymerized may be used.

Specific examples of the repeating unit represented by formula (I) are set forth below, however, the present invention is not limited thereto.

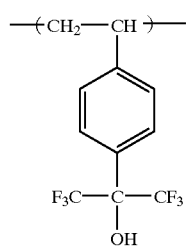
(I-1)

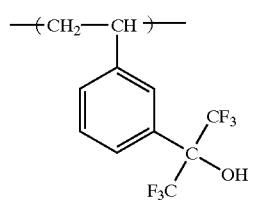
(I-2)

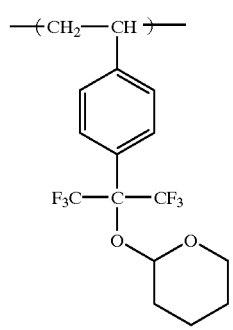
(I-3)

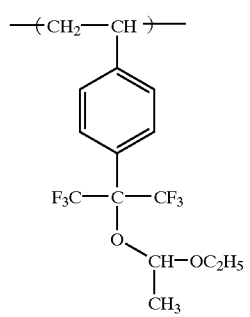
(I-4)

-continued

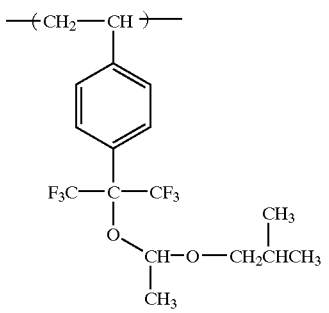
(I-5)

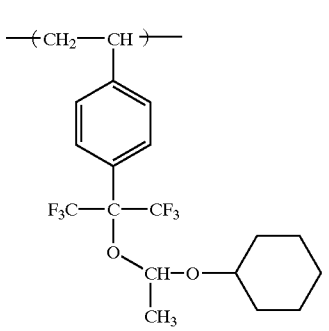
(I-6)

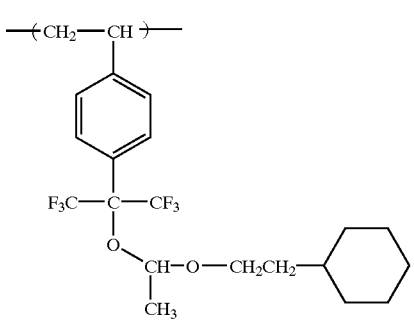
(I-7)

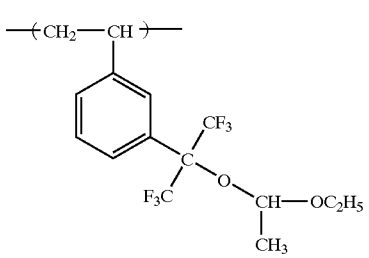
(I-8)

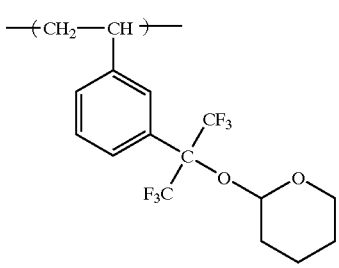
(I-9)

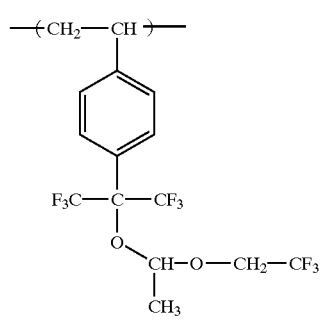 (I-10)
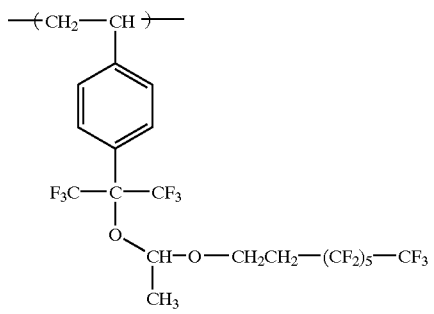 (I-15)
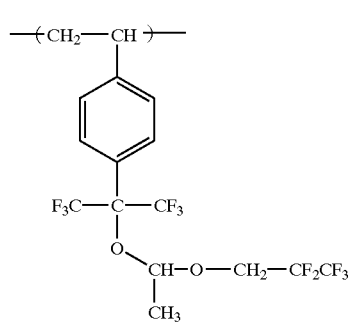 (I-11)
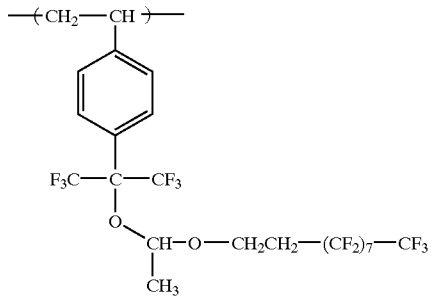 (I-16)
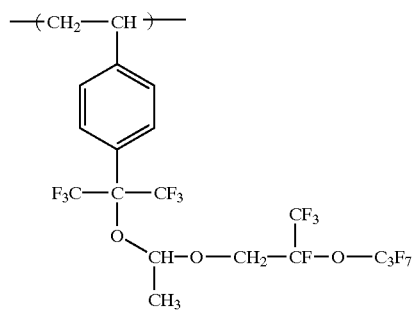 (I-12)
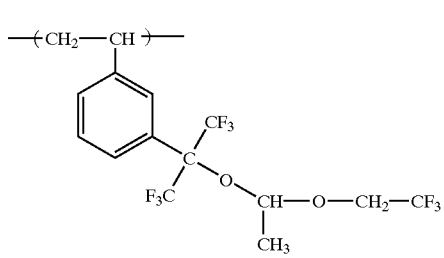 (I-17)
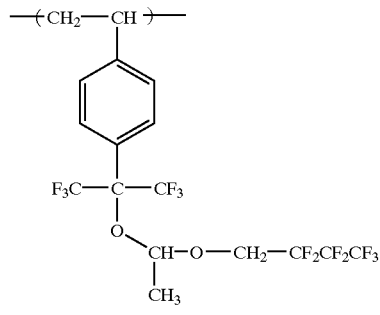 (I-13)
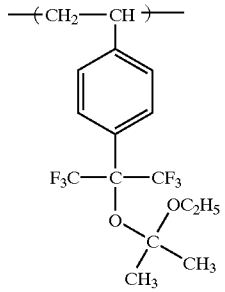 (I-18)
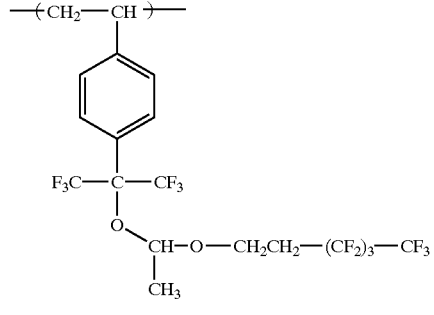 (I-14)
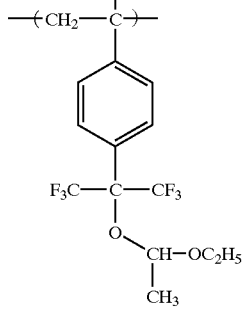 (I-19)

(I-20) 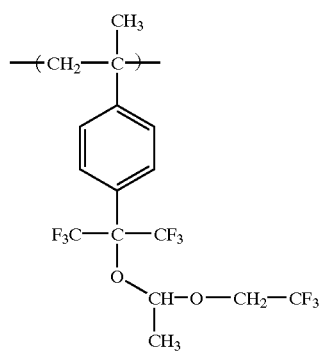
(I-21) 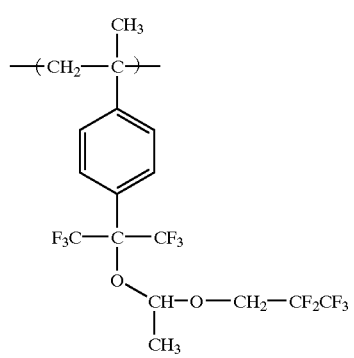
(I-22) 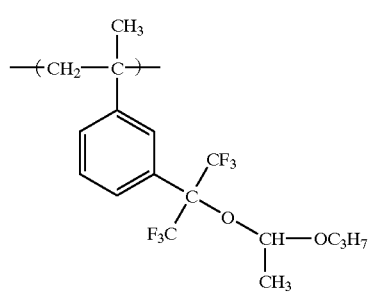
(I-23) 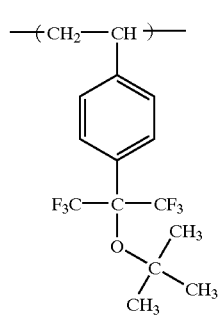
(I-24) 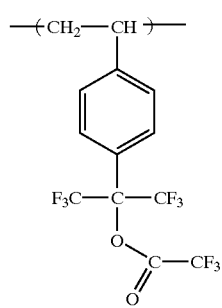
(I-25) 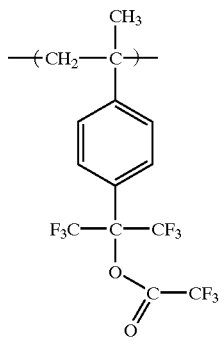
(I-26) 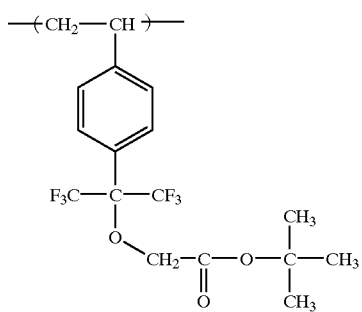
(I-27) 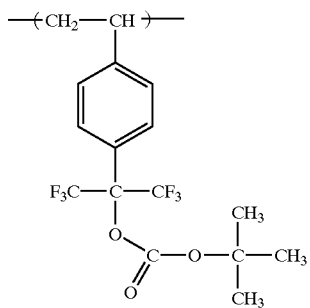
(I-28) 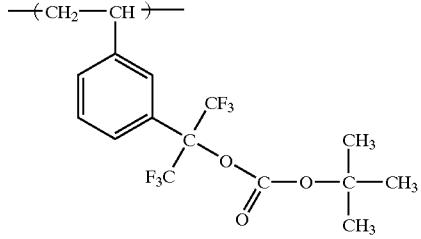
(I-29) 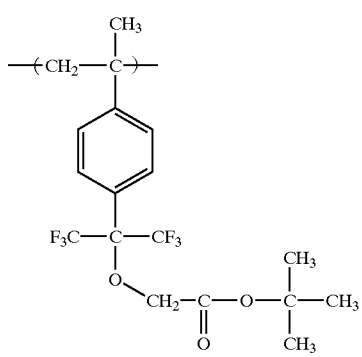

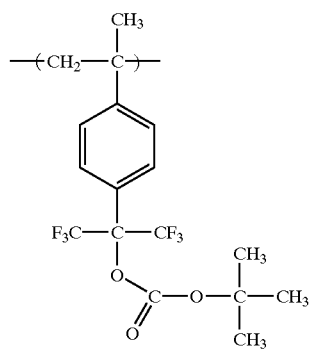
(I-30)
Specific examples of the repeating unit represented by formula (VII) are set forth below representatively as examples of B in the following formula (VII'), however, the present invention is not limited thereto.
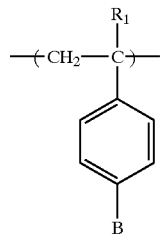
(VII')
wherein $R_1$ is H or $CH_3$.
Examples of B in formula (VII'):
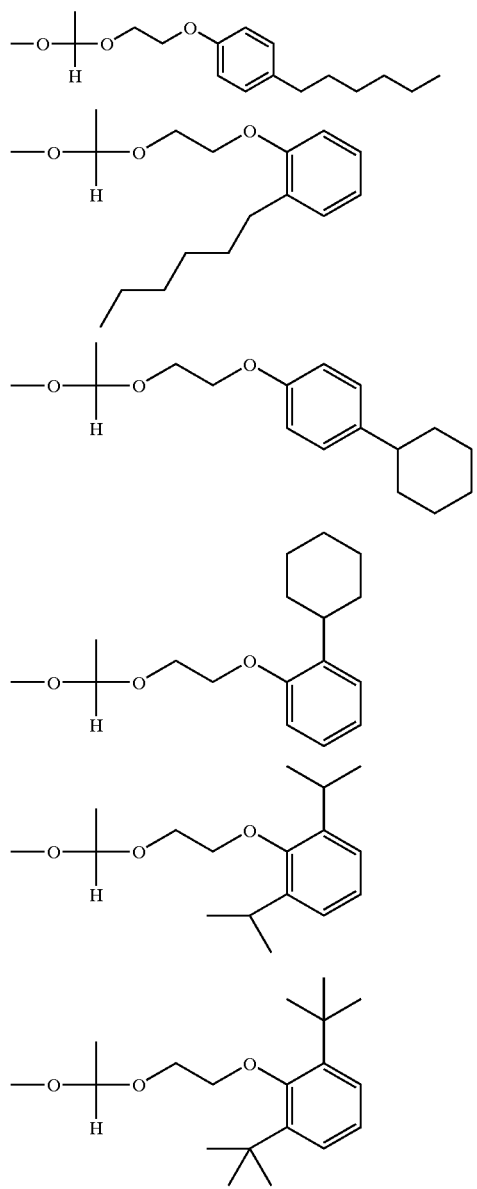
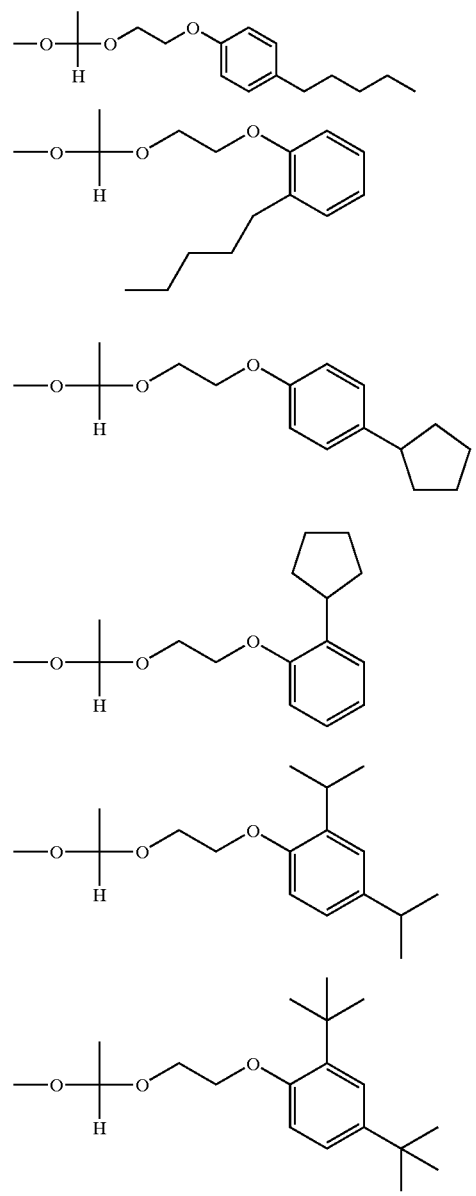

-continued
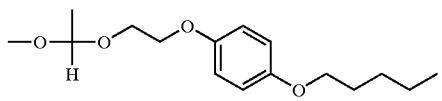
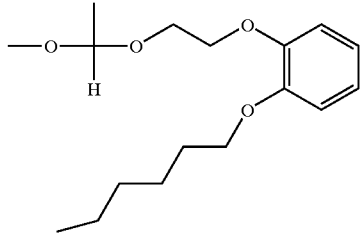
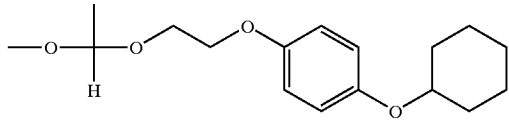
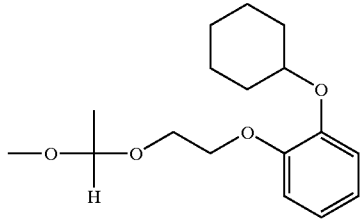
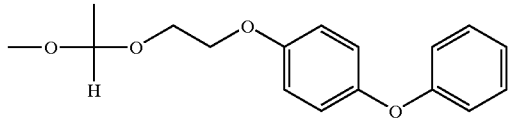
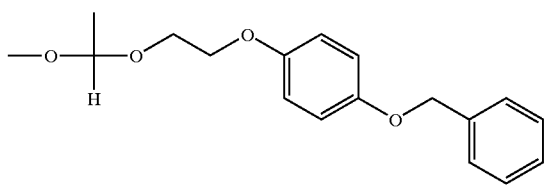
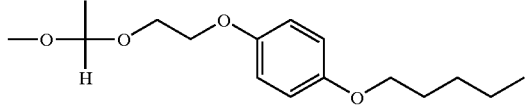
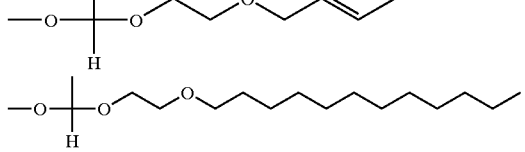
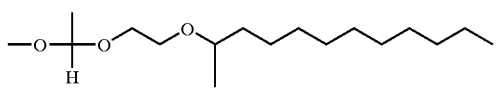
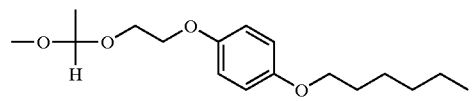
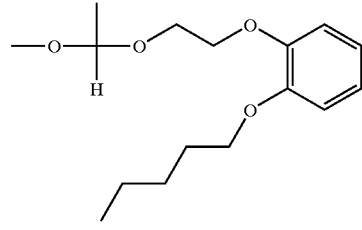
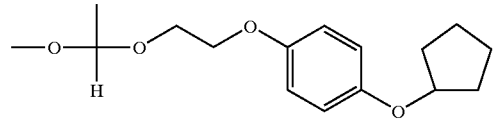
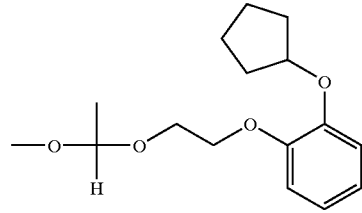
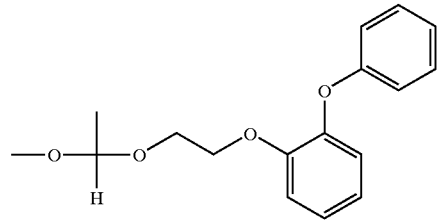
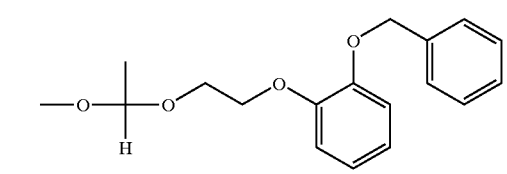
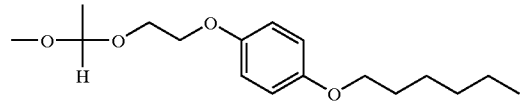
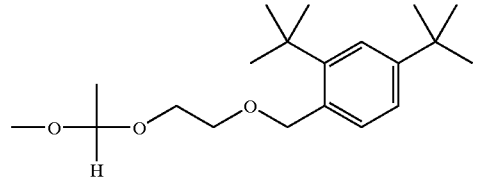
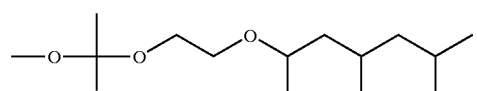
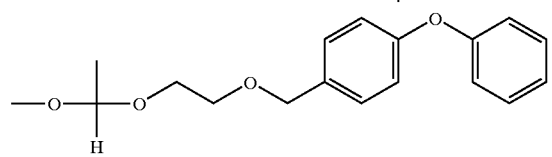

-continued
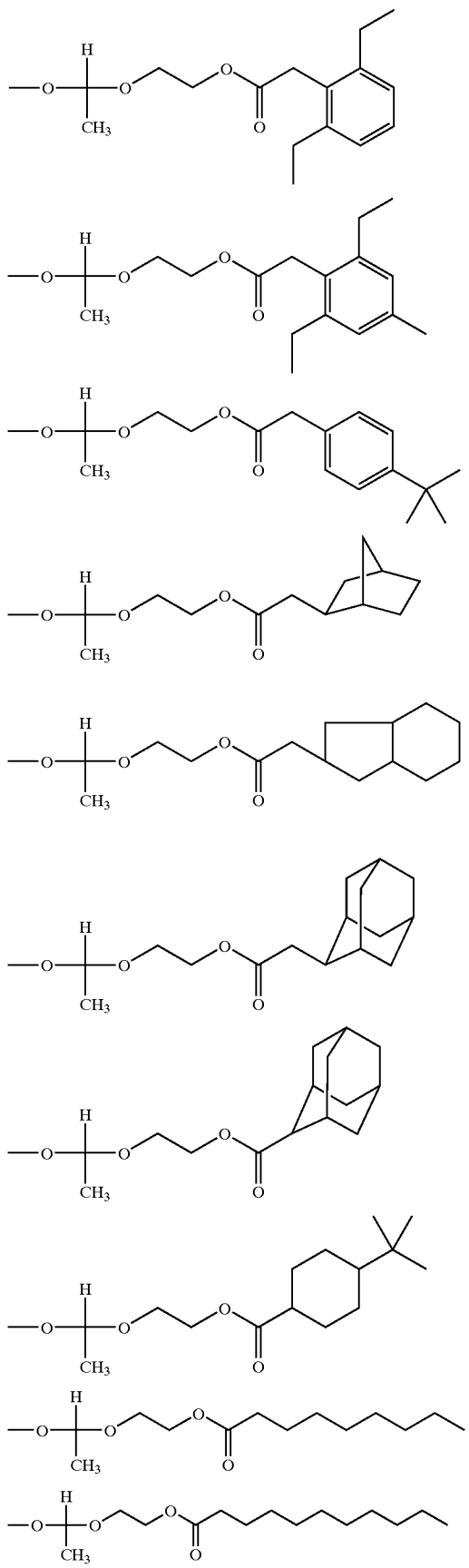
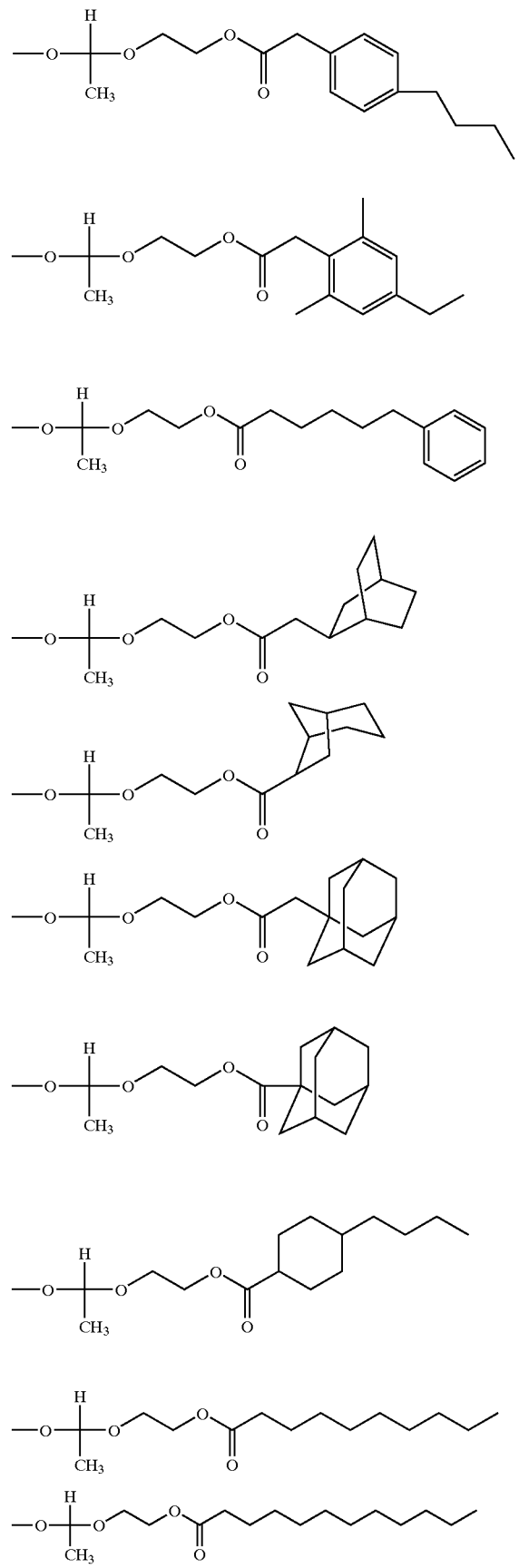

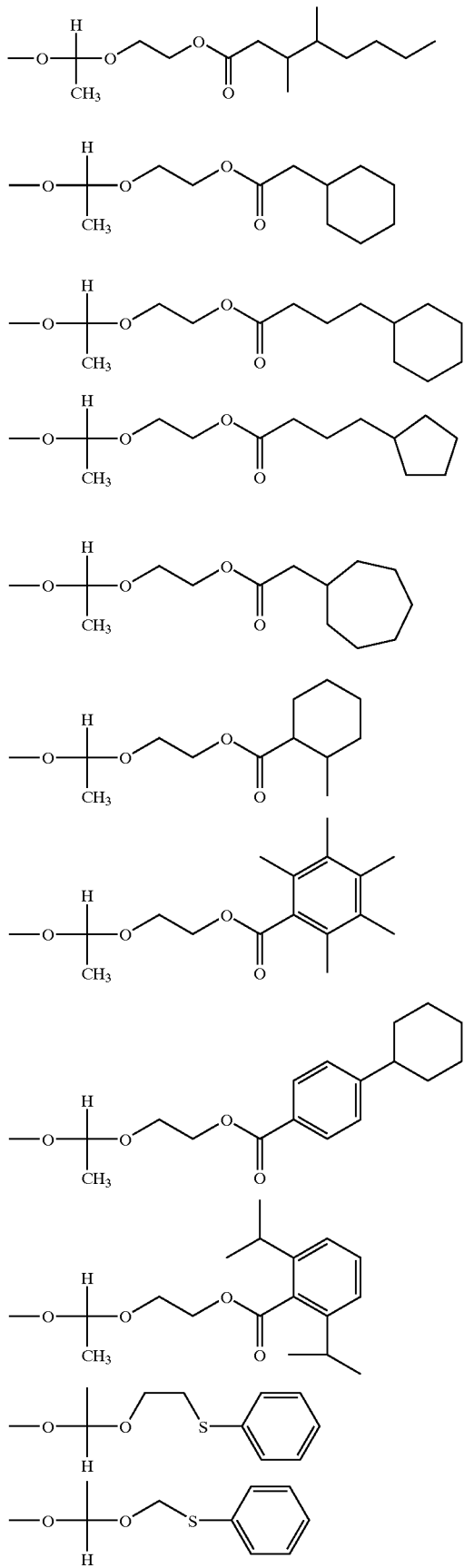

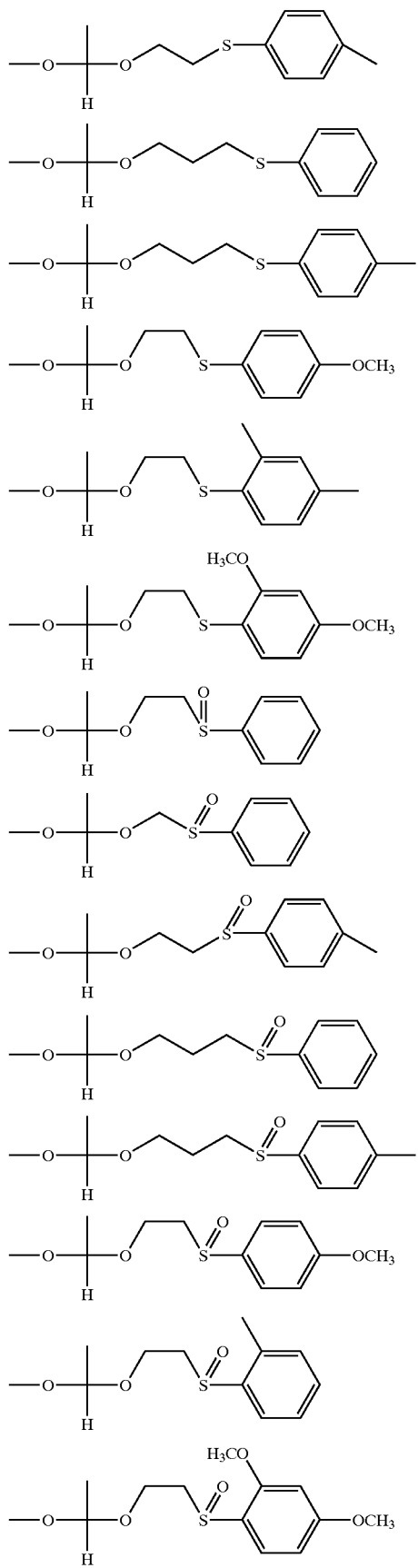

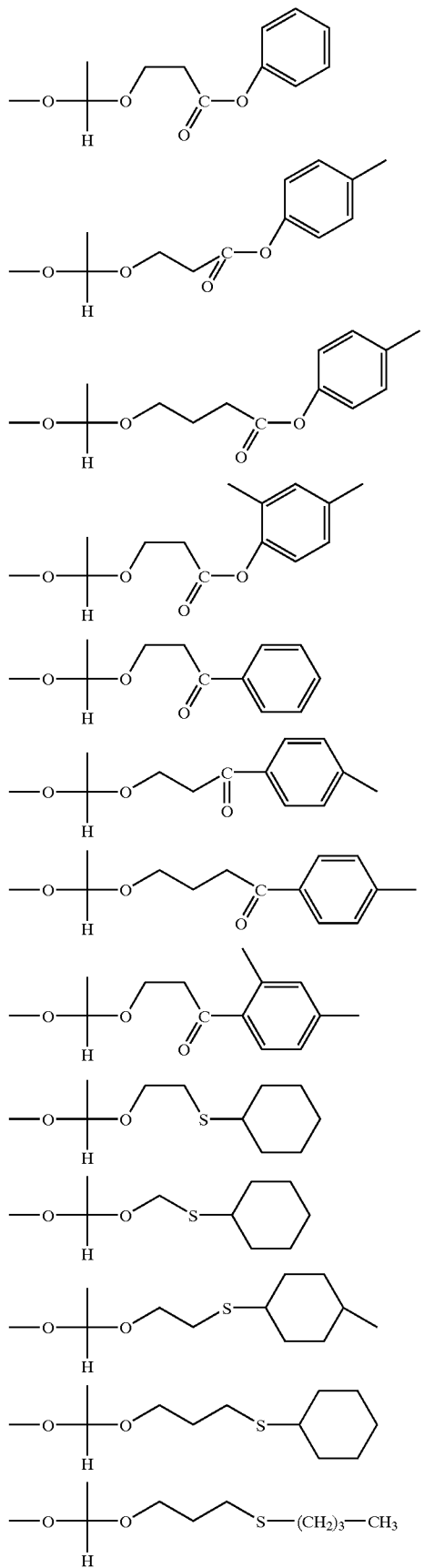

-continued
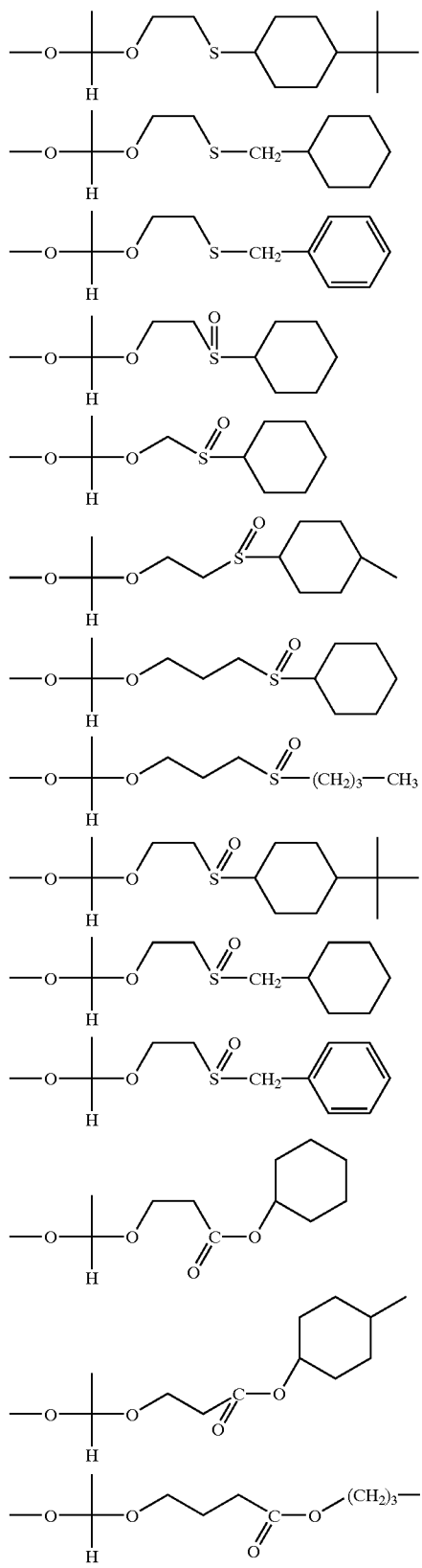
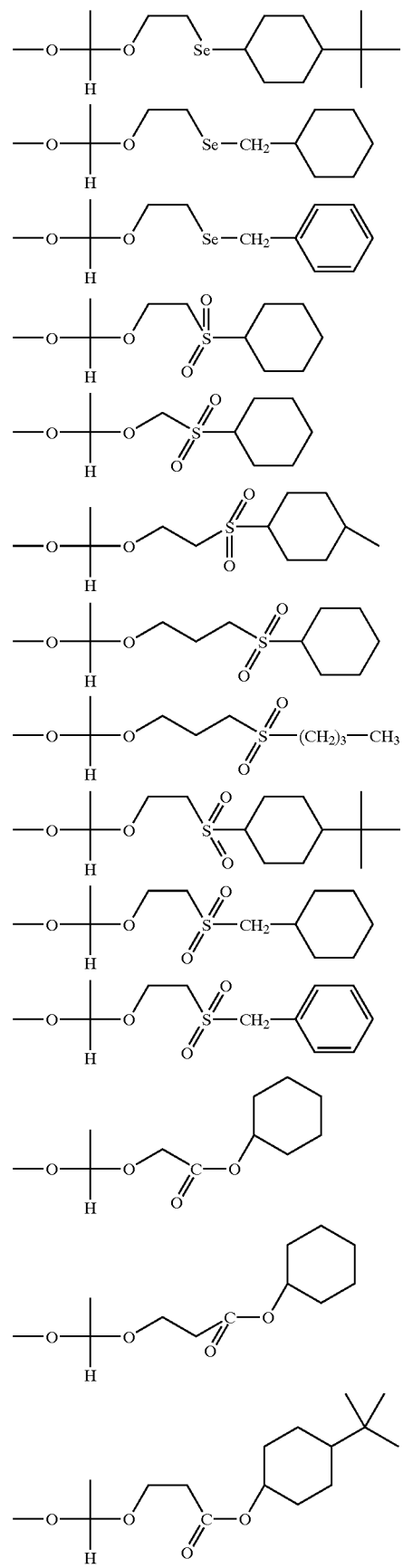

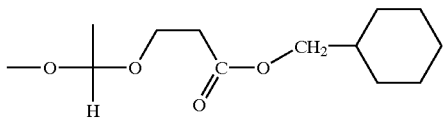
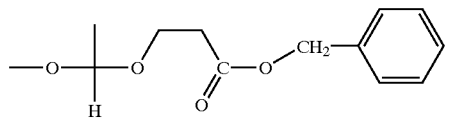

Specific examples of the repeating unit represented by formula (VI) are set forth below, however, the present invention is not limited thereto.

Specific examples of the repeating unit represented by formula (III) are set forth below, however, the present invention is not limited thereto.

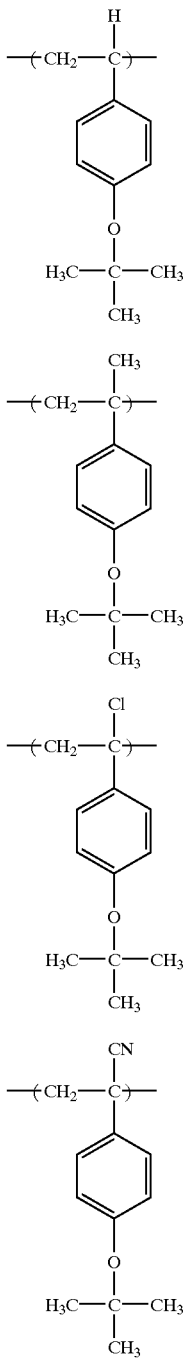

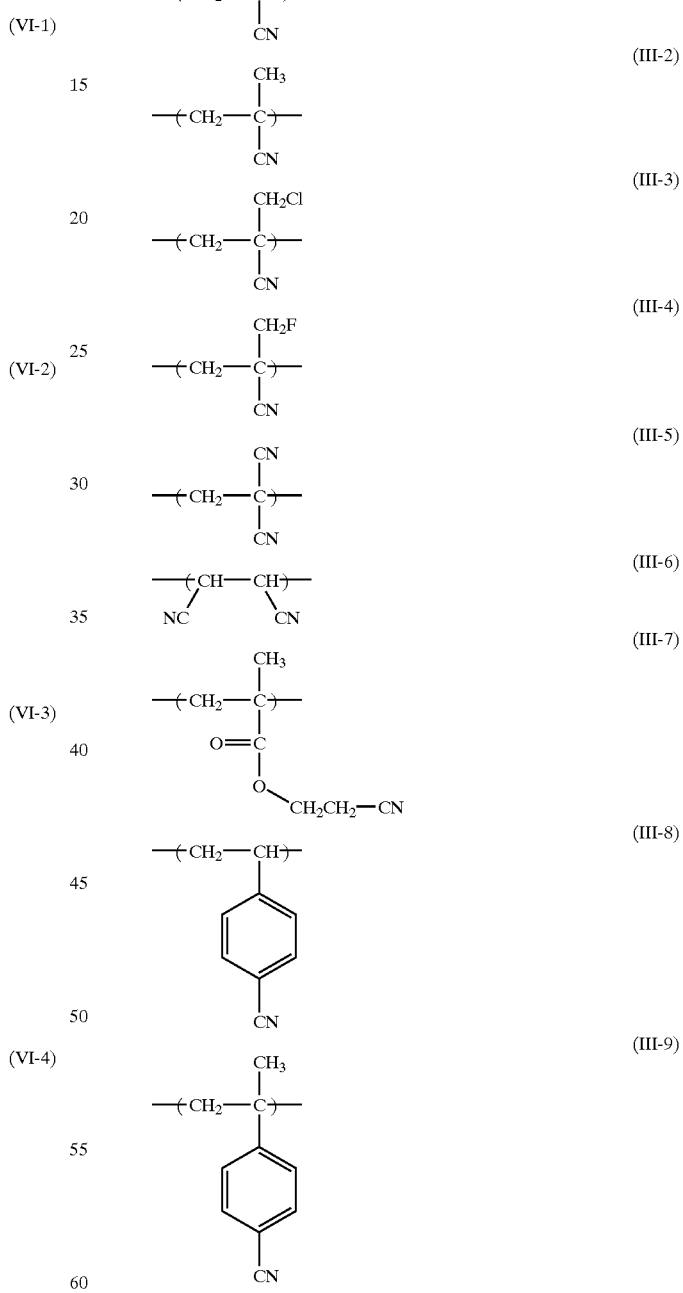

These repeating units set forth as specific examples may be used individually or in combination of two or more thereof.

The molecular weight of the resin (A) having the above-described repeating units is, in terms of the weight average, preferably from 1,000 to 200,000, more preferably from 3,000 to 20,000. The molecular weight distribution is from 1 to 10, preferably from 1 to 3, more preferably from 1 to 2. As the molecular weight distribution is smaller, the resolution, the resist shape and the side wall of resist pattern are smoother and the roughness property is better. The amount of the resin (A) added is from 5 to 99.5 wt %, preferably from 60 to 98 wt %, more preferably from 65 to 95 wt %, based on all solid contents in the composition. [2] Compound (B) Capable of Generating Acid Upon Irradiation with Actinic Rays or Radiation Examples of the compound capable of decomposing upon irradiation with actinic rays or radiation to generate an acid, which is used in the present invention, include a photoinitiator for photocationic polymerization, a photoinitiator for photoradical polymerization, a photo-decoloring agent for dyes, a photo-discoloring agent and a compound capable of generating an acid upon irradiation with known light used for microresist and the like (for example, ultraviolet or far ultraviolet light of 200 to 400 nm, preferably g line, h line, i line and a KrF excimer laser ray) or with an ArF excimer laser ray, an electron beam, an X ray, a molecular beam or an ion beam. The compound may be appropriately selected from these and a combination thereof.

Other examples of the compound capable of generating an acid upon irradiation with actinic rays or radiation for use in the present invention include onium salts such as diazonium salts described in S. I. Schlesinger, Photogr. Sci. Eng., 18, 387 (1974), T. S. Bal et al., Polymer, 21, 423 (1980), etc., ammonium salts described in U.S. Pat. Nos. 4,069,055, 4,069,056 and Re27,992, JP-A-3-140140, etc., phosphonium salts described in D.C. Necker et al., Macromolecules, 17, 2468 (1984), C. S. Wen et al., Teh, Proc. Conf. Rad. Curing ASIA, p. 478, Tokyo, Oct. (1988), U.S. Pat. Nos. 4,069,055 and 4,069,056, etc., iodonium salts described in J. V. Crivello et al., Macromolecules, 10 (6) 1307 (1977), Chem. & Eng. News, November 28, p. 31 (1988), European Patents 104,143, 339,049 and 410,201, JP-A-2-150848, JP-A-2-296514, etc., sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 161,811, 410,201, 339,049, 233,567, 297,443 and 297,442, U.S. Pat. Nos. 4,933,377, 3,902,114, 4,760,013, 4,734,444 and 2,833,827, German Patent 2,904, 626, 3,604,580 and 3,604,581, etc., selenonium salts described in J. V. Crivello et al., Macromolecules, 10 (6), 1307 (1977), J. V. Crivello et al., J. Polymer Sci., Polymer Chem. Ed., 17, 1047 (1979), etc., and arsonium salts described in C. S. Wen et al., Teh, Proc. Conf. Rad. Curing ASIA, p. 478, Tokyo, October (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A-2-161445, etc.; photo-acid generators having an O-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin 1,1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290,750, 046,083, 156,535, 271,851 and 0,388, 343, U.S. Pat. Nos. 3,901,710 and 4,181,531, JP-A-60-198538, JP-A-53-133022, etc.; compounds which photochemically decompose to generate a sulfonic acid, represented by iminosulfonate, described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 044,115, 618,564 and 0,101,122, U.S. Pat. Nos. 4,371,605 and 4,431, 774, JP-A-64-18143, JP-A-2-245756, JP-A-3-140109, etc.; and disulfone compounds described in JP-A-61-166544.

In addition, compounds in which the above-described group or compound capable of generating an acid upon irradiation with actinic rays or radiation is introduced into the main chain or side chain of a polymer may also be used and examples thereof include the compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, the compounds capable of generating an acid upon irradiation with light, described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent 126, 712, etc. may also be used.

Among these compounds capable of decomposing upon irradiation with actinic rays or radiation to generate an acid, particularly effective compounds are described below.

(1) Oxazole derivative represented by the following formula (PAG1) and S-triazine derivative represented by formula (PAG2), each substituted by trihalomethyl group:

(PAG1)

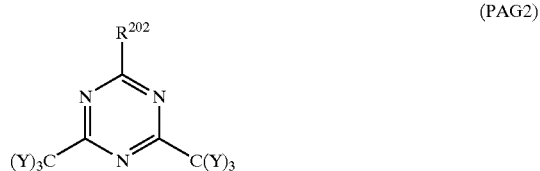

(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —C(Y)$_3$, and Y represents a chlorine atom or a bromine atom.

Specific examples thereof include the following compounds, however, the present invention is not limited thereto.
(PAG1-1)
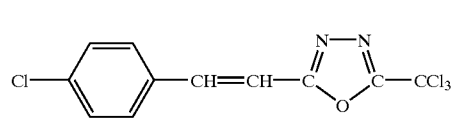
(PAG1-2)
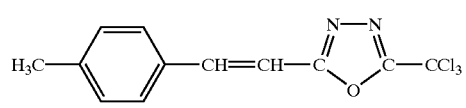
(PAG1-3)
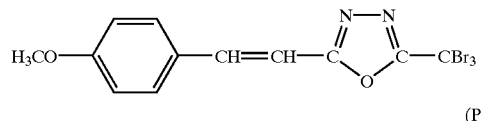
(PAG1-4)
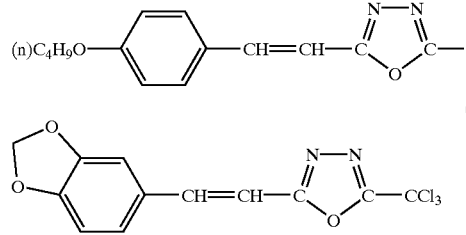
(PAG1-5)
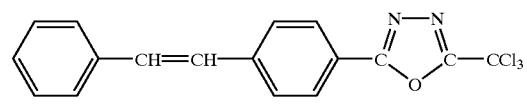
(PAG1-6)
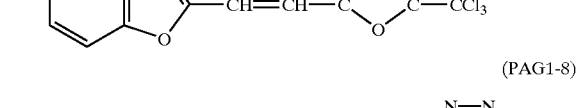
(PAG1-7)
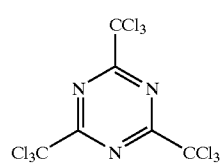
(PAG1-8)
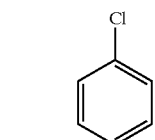
(PAG2-1)
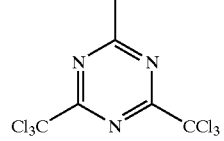
(PAG2-2)
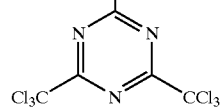
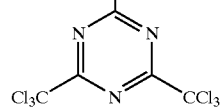
-continued
(PAG2-3)
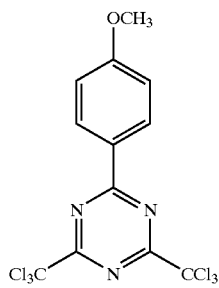
(PAG2-4)
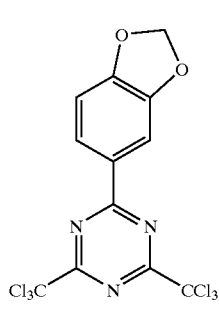
(PAG2-5)
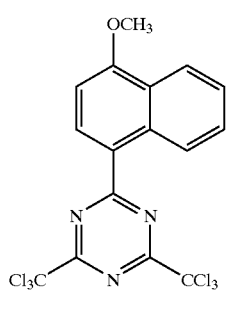
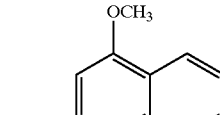
(PAG2-6)
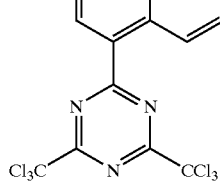
(PAG2-7)
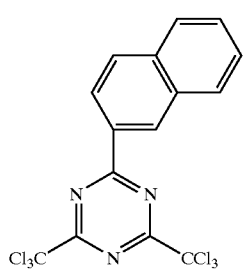

-continued

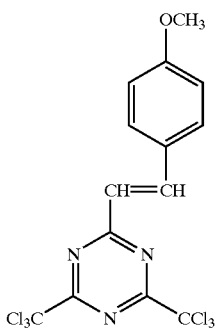

(PAG2-8)

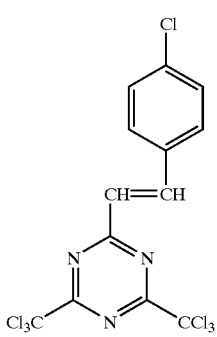

(PAG2-9)

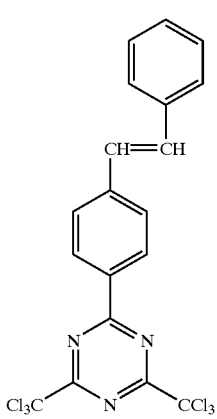

(PAG2-10)

(2) Iodonium salt represented by the following formula (PAG3) and sulfonium salt represented by formula (PAG4):

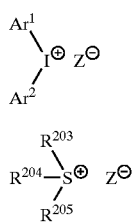

(PAG3)

(PAG4)

In formula (PAG3), $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

In formula (PAG4), $R^{203}$, $R^{204}$ and $R^{205}$ each independently represents a substituted or unsubstituted alkyl group or a substituted or unsubstituted aryl group, preferably an aryl group having from 6 to 14 carbon atoms, an alkyl group having from 1 to 8 carbon atoms, or a substituted derivative thereof. Preferred examples of the substituent for the aryl group include an alkoxy group having from 1 to 8 carbon atoms, an alkyl group having from 1 to 8 carbon atoms, a cycloalkyl group, a nitro group, a carboxyl group, a mercapto group, a hydroxy group and a halogen atom, and preferred examples of the substituent for the alkyl group include an alkoxy group having from 1 to 8 carbon atoms, a carboxyl group and an alkoxycarbonyl group.

In formulae (PAG3) and (PAG4), $Z^-$ represents an anion and specific examples thereof include alkyl sulfonate anion, cycloalkyl sulfonate anion, perfluoroalkyl sulfonate anion and aryl sulfonate anion (for example, benzenesulfonate anion, naphthalene sulfonate anion and anthracene sulfonate anion, which each may have a substituent).

Two of $R^{203}$, $R^{204}$ and $R^{205}$, or $Ar^1$ and $Ar^2$ may combine with each other through a single bond or a substituent.

Specific examples thereof include the following compounds, however, the present invention is not limited thereto.

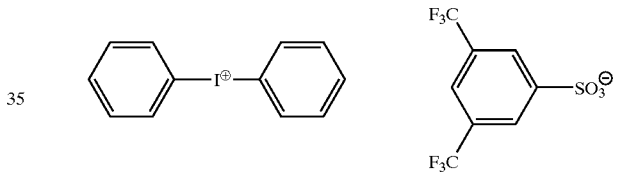

(PAG3-1)

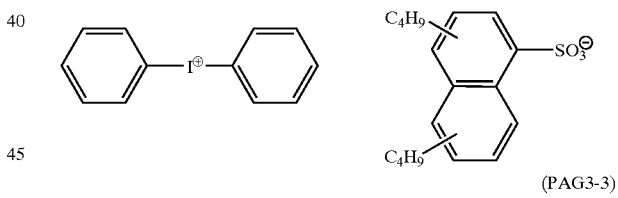

(PAG3-2)

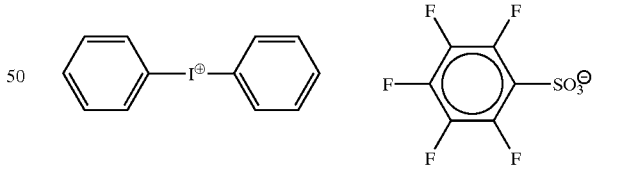

(PAG3-3)

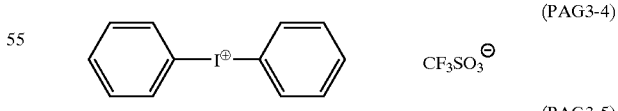

(PAG3-4)

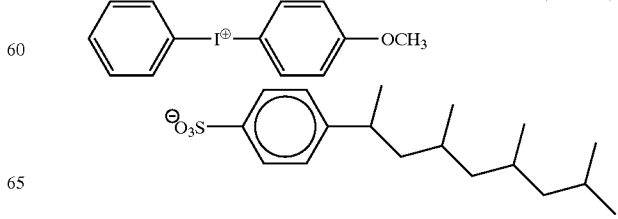

(PAG3-5)

(PAG3-6)
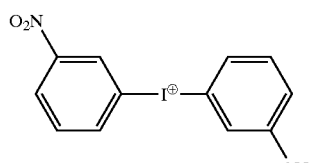 C$_4$F$_9$SO$_3^\ominus$
(PAG3-7)
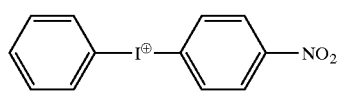
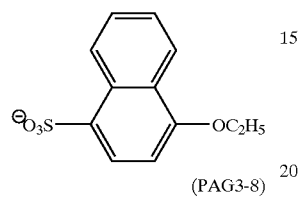
(PAG3-8)
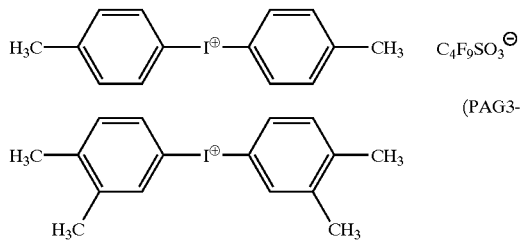 C$_4$F$_9$SO$_3^\ominus$
(PAG3-9)
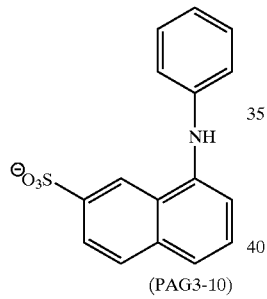
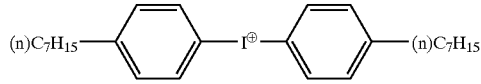
(PAG3-10)
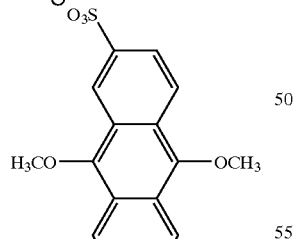
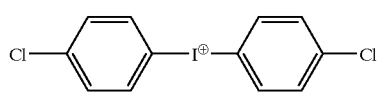
(PAG3-11)
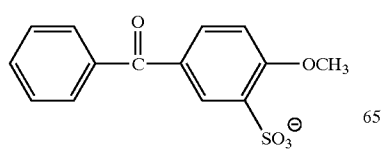
(PAG3-12)
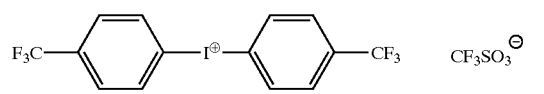 CF$_3$SO$_3^\ominus$
(PAG3-13)
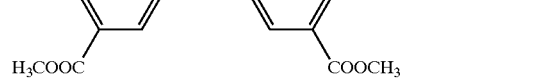
(PAG3-14)
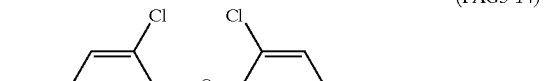
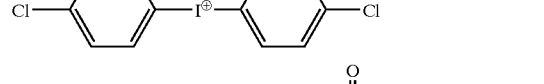
(PAG3-15)
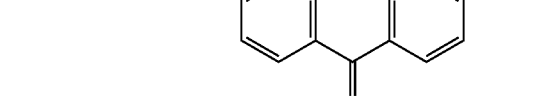
(PAG3-16)
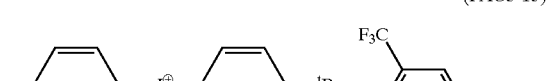
(PAG3-17)
 CF$_3$SO$_3^\ominus$
(PAG3-18)
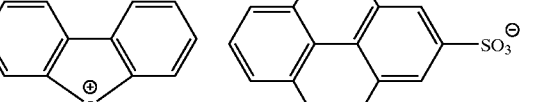
(PAG3-19)
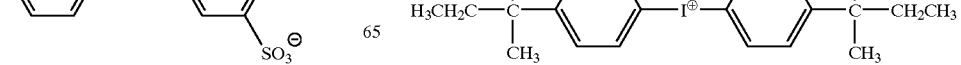

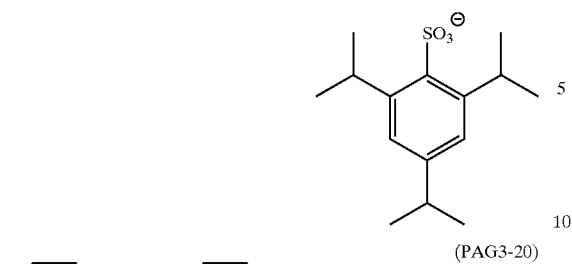
(PAG3-20)
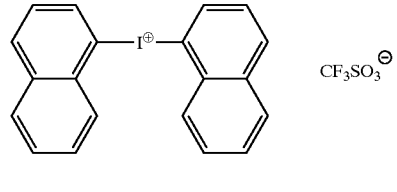
(PAG3-21)
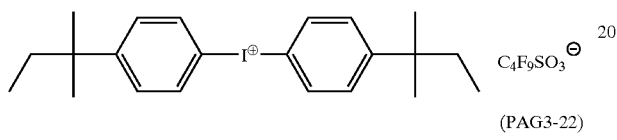
(PAG3-22)
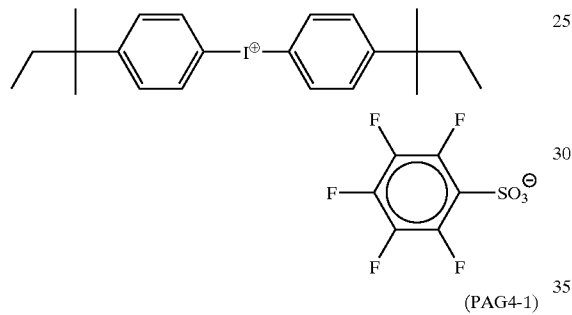
(PAG4-1)
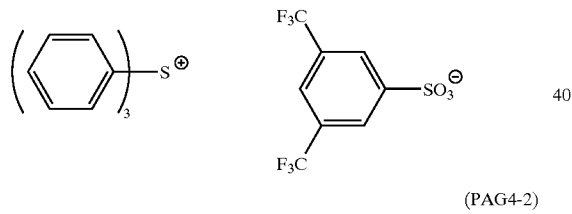
(PAG4-2)
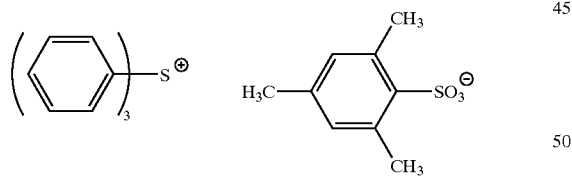
(PAG4-3)
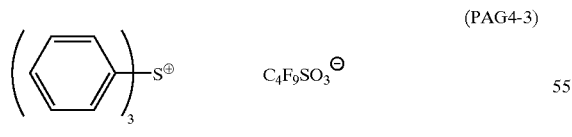
(PAG4-4)
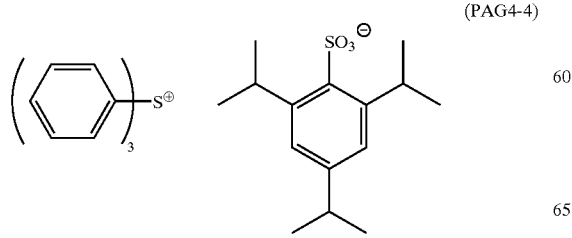
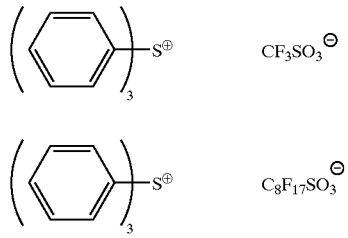
(PAG4-5)
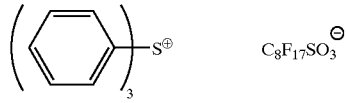
(PAG4-6)
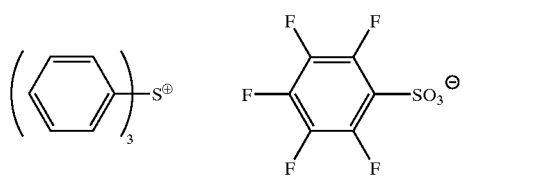
(PAG4-7)
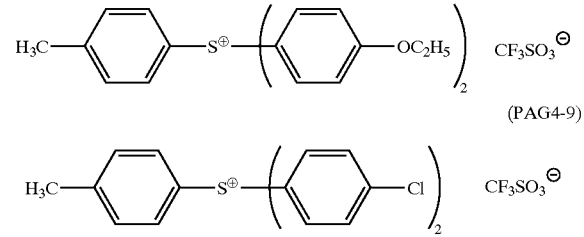
(PAG4-8)
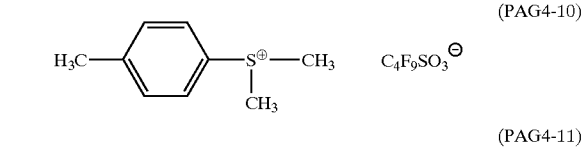
(PAG4-9)
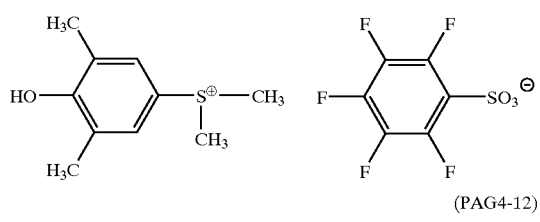
(PAG4-10)
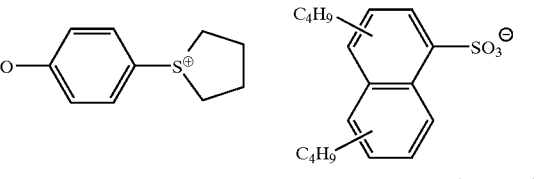
(PAG4-11)
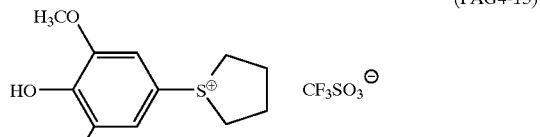
(PAG4-12)
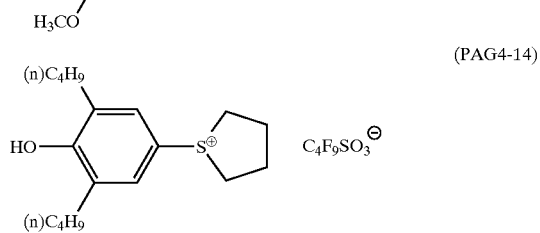
(PAG4-13)
(PAG4-14)

-continued
(PAG4-15)
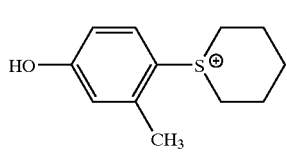 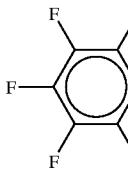
(PAG4-16)
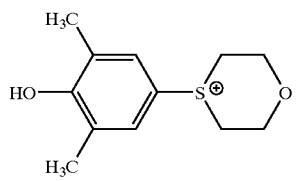 
(PAG4-17)
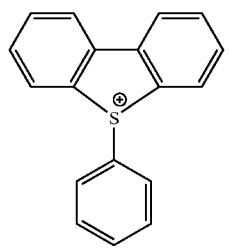 C$_8$F$_{17}$SO$_3^\ominus$
(PAG4-18)
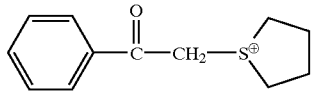 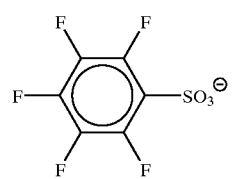
(PAG4-20)
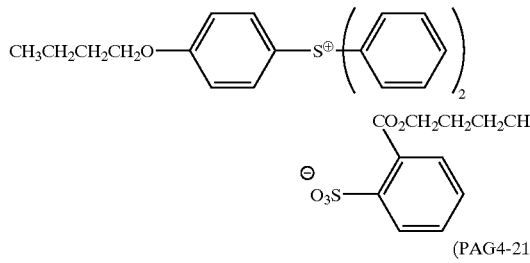
(PAG4-21)
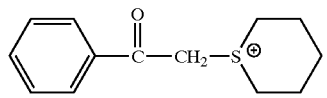 C$_4$H$_9$SO$_3^\ominus$
(PAG4-22)
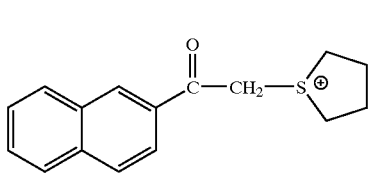 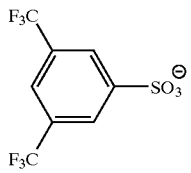
(PAG4-23)
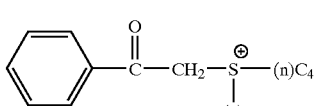 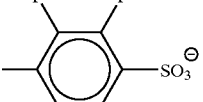
-continued
(PAG4-24)
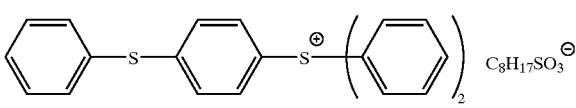 C$_8$H$_{17}$SO$_3^\ominus$
(PAG4-25)
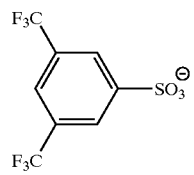
(PAG4-26)
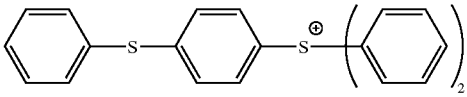 2CF$_3$SO$_3^\ominus$
(PAG4-27)
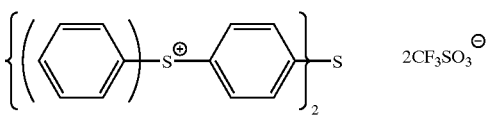
2 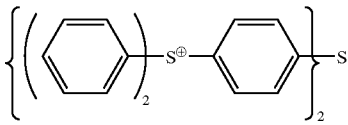
(PAG4-28)
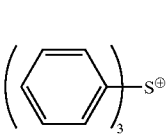 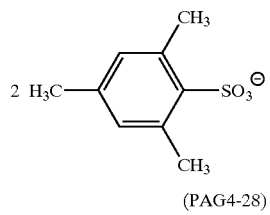
(PAG4-29)
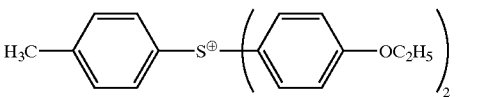
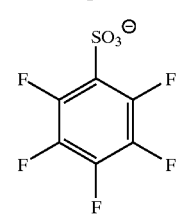

-continued (PAG4-30)
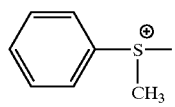
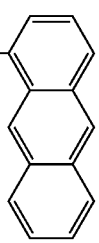

(PAG4-31)
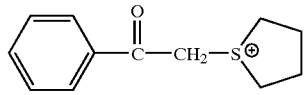
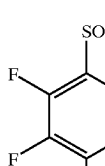

(PAG4-32)
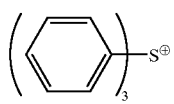
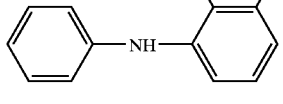

The above-described onium salts represented by formulae (PAG3) and (PAG4) are known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfone derivative represented by the following formula (PAG5) and iminosulfonate derivative represented by formula (PAG6):

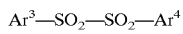  (PAG5)

(PAG6)
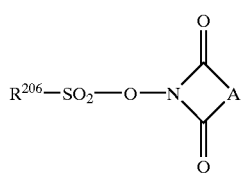

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention is not limited thereto.

(PAG5-1)
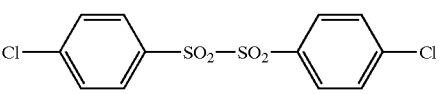

(PAG5-2)
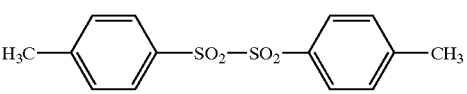

(PAG5-3)
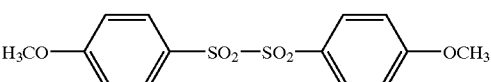

(PAG5-4)
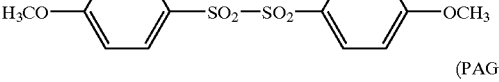

(PAG5-5)
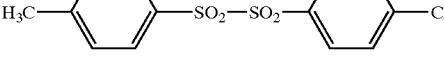

(PAG5-6)
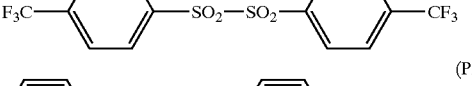

(PAG5-7)
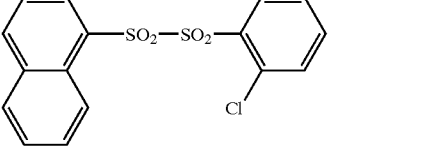

(PAG5-8)
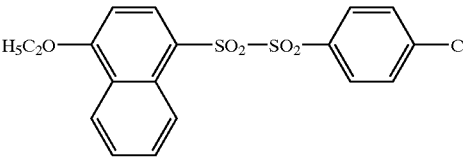

(PAG5-9)
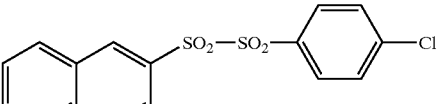

PAG5-10)
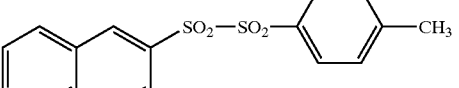

(PAG5-11)
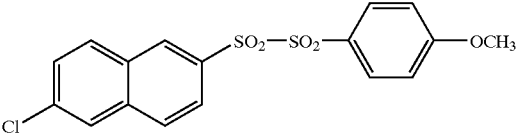

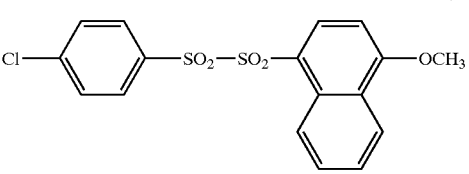

-continued
(PAG5-12)
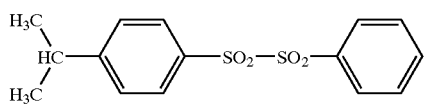
(PAG5-13)
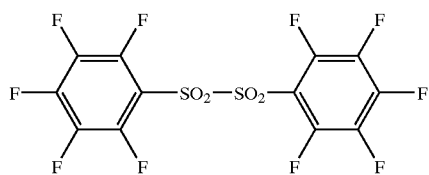
(PAG5-14)
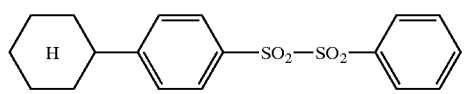
(PAG5-15)
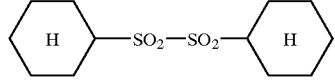
(PAG6-1)
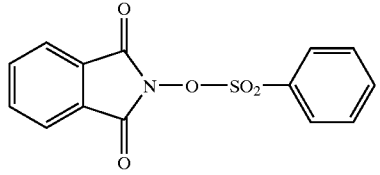
(PAG6-2)
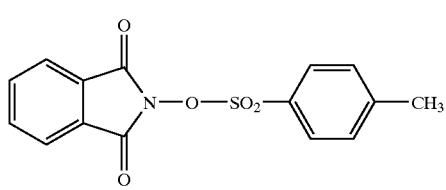
(PAG6-3)
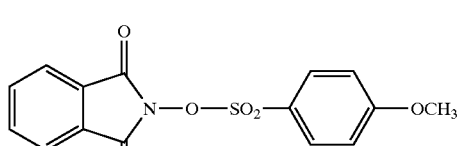
(PAG6-4)
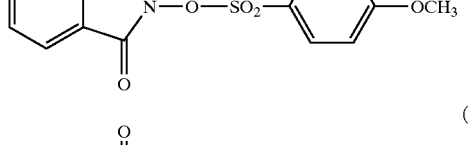
(PAG6-5)
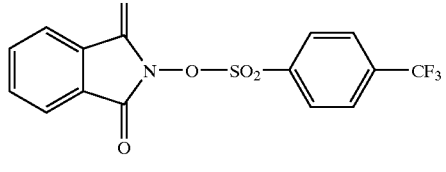
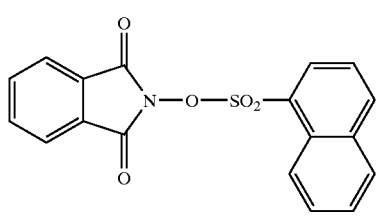
-continued
(PAG6-6)
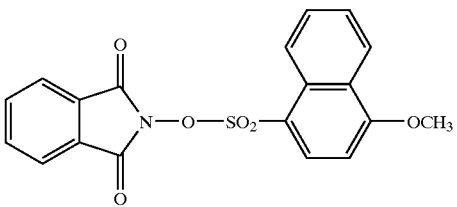
(PAG6-7)
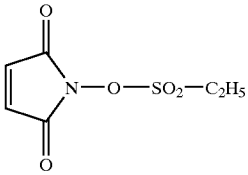
(PAG6-8)
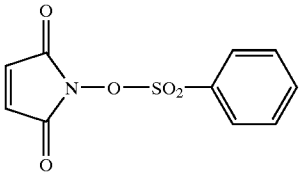
(PAG6-9)
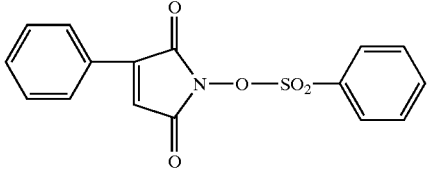
(PAG6-10)
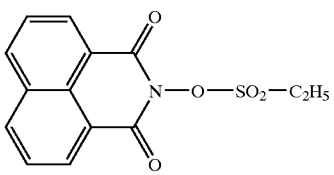
(PAG6-11)
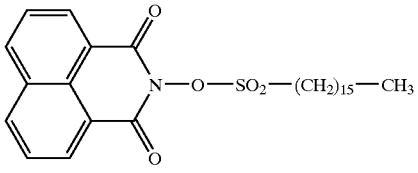
(PAG6-12)
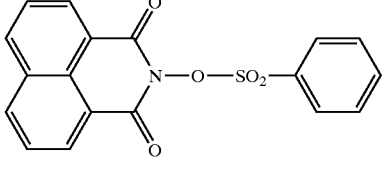
(PAG6-13)
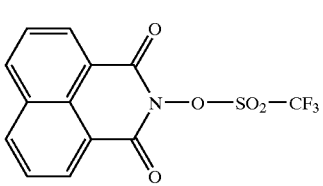

-continued

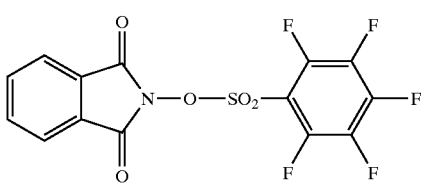 (PAG6-14)

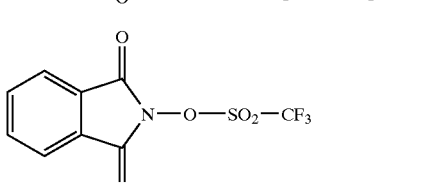 (PAG6-15)

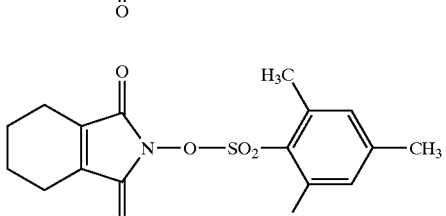 (PAG6-16)

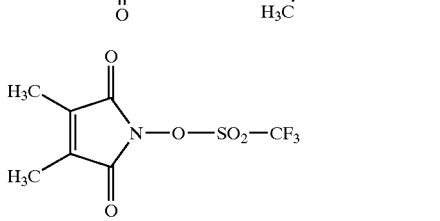 (PAG6-17)

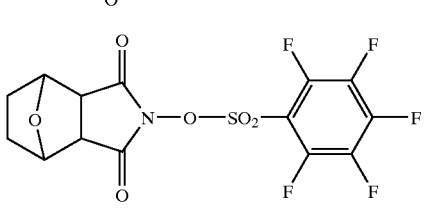 (PAG6-18)

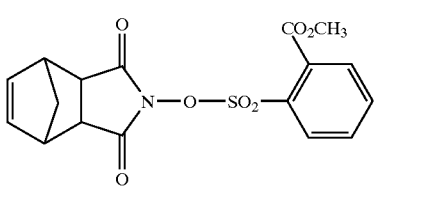 (PAG6-19)

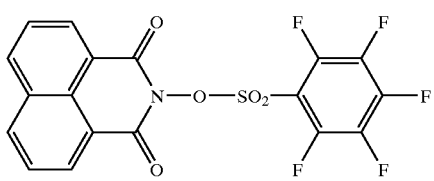 (PAG6-20)

(4) Diazodisulfone derivative represented by the following formula (PAG7)

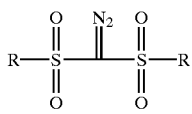 (PAG7)

wherein R represents a linear, branched or cyclic alkyl group or an aryl group which may be substituted.

Specific examples thereof include the following compounds, the present invention is not limited thereto.

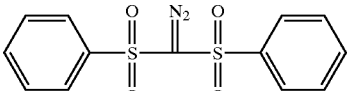 (PAG7-1)

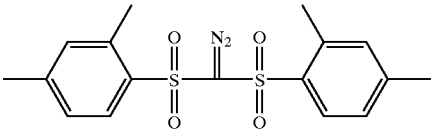 (PAG7-2)

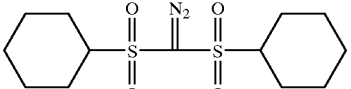 (PAG7-3)

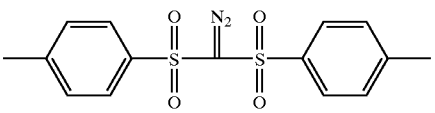 (PAG7-4)

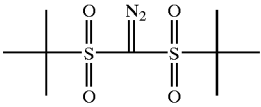 (PAG7-5)

(5) Oxime sulfonate derivative represented by the following formula (PAG8)

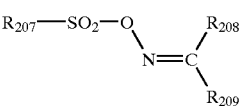 (PAG8)

wherein $R_{207}$ represents a substituted or unsubstituted alkyl group, a substituted or unsubstituted cycloalkyl group, a substituted or unsubstituted aryl group or a substituted or unsubstituted aralkyl group, $R_{208}$ and $R_{209}$ each represents a substituted or unsubstituted alkyl group, a substituted or unsubstituted cycloalkyl group, a substituted or unsubstituted aryl group, a substituted or unsubstituted aralkyl group, a substituted or unsubstituted cyano group or a substituted or unsubstituted acyl group, and $R_{208}$ and $R_{209}$ may combine to form a carbon ring or a heterocyclic ring having an oxygen atom, a nitrogen atom or a sulfur atom.

Specific examples thereof include the following compounds, however, the present invention is not limited thereto.

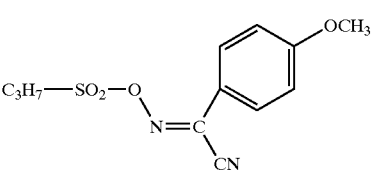 (PAG8-1)

-continued

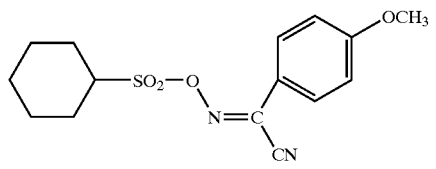
(PAG8-2)

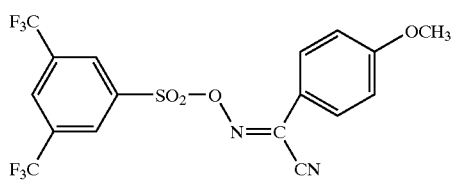
(PAG8-3)

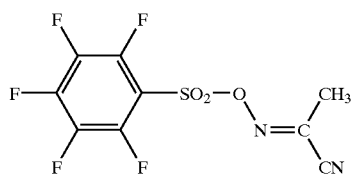
(PAG8-4)

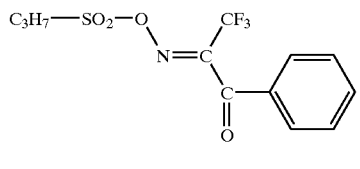
(PAG8-5)

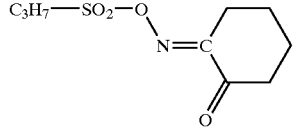
(PAG8-6)

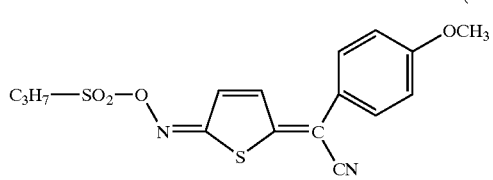
(PAG8-7)

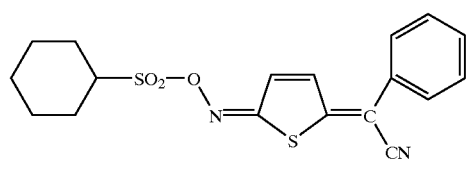
(PAG8-8)

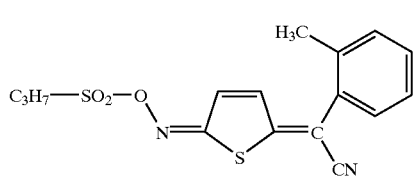
(PAG8-9)

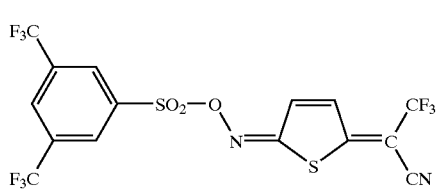
(PAG8-10)

The amount added of the compound (B) capable of generating an acid upon irradiation with actinic rays or radiation, for use in the present invention, is from 0.1 to 20 wt %, preferably from 0.5 to 10 wt %, more preferably from 1 to 7 wt %, based on all solid contents in the composition of the present invention. These compounds may be used individually or as a mixture of a plurality of the compounds.

[3] Acid Diffusion Inhibitor (C)

The composition of the present invention preferably contains an acid diffusion inhibitor for the purpose of preventing fluctuation in performance (e.g., T-top shape formation of pattern, fluctuation in sensitivity, fluctuation in line width of pattern) with the passage of time after the irradiation with actinic rays or radiation until the heat-treatment, fluctuation due to aging after the coating, or excess diffusion of acid (deterioration of resolution) at the time of heat-treatment after the irradiation with actinic rays or radiation. The acid diffusion inhibitor is an organic basic compound, for example, an organic basic compound containing a basic nitrogen. A compound where the conjugate acid has a pKa value of 4 or more is preferably used.

Specific examples thereof include the following structures (A) to (E):

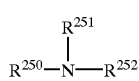 (A)

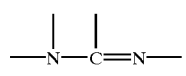 (B)

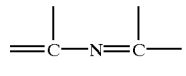 (C)

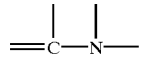 (D)

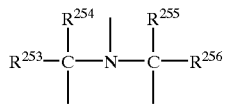 (E)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, $R^{251}$ and $R^{252}$ may combine with each other to form a ring, and $R^{253}$ $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms different in the chemical structure within one molecule, still more preferably a compound having both a substituted or unsubstituted amino group and a ring structure containing a nitrogen atom, or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, an substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group.

More preferred compounds are guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethyl-aminopyridine, 2-diethylaminopyridine, 2-(aminomethyl)-pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used individually or in combination of two or more thereof.

The ratio between the acid generator and the organic basic compound used in the composition is preferably 2.5 to 300 {(acid generator)/(organic basic compound) (by mol)}. If this molar ratio is less than 2.5, low sensitivity results and the resolution may decrease in some cases, whereas if it exceeds 300, the thickening of the pattern increases in aging after the exposure until the heat-treatment and the resolution sometimes decreases. The (acid generator)/(organic basic compound) (by mol) is preferably from 5.0 to 200, more preferably from 7.0 to 150.

[4] Fluorine-Containing and/or Silicon-Containing Surfactant which can be Used in the Present Invention The positive resist composition of the present invention may contain a fluorine-containing and/or silicon-containing surfactant. More specifically, the positive resist composition of the present invention may contain any one of a fluorine-containing surfactant, a silicon-containing surfactant and a surfactant containing both a fluorine atom and a silicon atom, or may contain two or more thereof. By the addition of this fluorine-containing and/or silicon-containing surfactant, an effect of preventing the development defect and improving the coatability is provided.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,296,143, 5,294,511 and 5,824,451. The following commercially available surfactants each may also be used as it is.

Examples of the commercially available surfactant which can be used include fluorine-containing surfactants and silicon-containing surfactants, such as Eftop EF301, EF303 and EF352 (produced by Shin-Akita Kasei K. K.), Florad FC430 and 431 (produced by Sumitomo 3M Inc.), Megafac F171, F173, F176, F189 and R08 (produced by Dainippon Ink & Chemicals, Inc.), Asahi Guard AG710, Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

The amount of the surfactant blended is usually from 0.01 to 2 wt %, preferably from 0.01 to 1 wt %, based on the solid content in the composition of the present invention. These surfactants may be added individually or in combination of two or more thereof.

[5] Other Components Used in the Composition of the Present Invention
(2) Solvents The composition of the present invention is dissolved in a solvent which can dissolve the above-described respective components, and then coated on a support. Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone and tetrahydrofuran. These solvents are used individually or in combination.

For forming a pattern on a resist film, for example, in the production of a precision integrated circuit device, the positive resist composition of the present invention is coated on a substrate (e.g., transparent substrate such as silicon/silicon dioxide coated glass substrate or ITO substrate), irradiated with actinic rays or radiation using an image-drawing apparatus, heated, developed, rinsed and dried, whereby a good resist pattern can be formed.

The developer which can be used for the positive resist composition of the present invention is an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). This aqueous alkali solution may be used after adding thereto an appropriate amount of an alcohol (e.g., isopropyl alcohol) or a surfactant (e.g., non-ionic surfactant).

Among these developers, preferred are quaternary ammonium salts, more preferred are tetramethylammonium hydroxide and choline.

EXAMPLE

The present invention is described in greater detail below by referring to Examples, however, the present invention should not be construed as being limited thereto.

Synthesis Example 1

In 60 ml of 2-methoxy-2-propanol, 18.9 g (0.07 mol) of 4-[bis(trifluoromethyl)-hydroxymethyl]styrene and 11.0 g (0.03 mol) of 4-[1-(p-cyclohexylphenyloxy)ethoxyethoxy]-styrene were dissolved. Thereto, 0.25 g of 2,2'-azobis(2,4- dimethylvaleronitrile) (V-65, trade name, produced by Wako Pure Chemical Industries, Ltd.) was added as a polymerization initiator and the resulting solution was added dropwise to 10 ml of 1-methoxy-2-propanol heated at 70° C., while stirring over 2 hours in a nitrogen stream. After the completion of dropwise addition, the reaction solution was continuously stirred for 4 hours and then poured into 1 liter of methanol/ion exchange water (1/1) while vigorously stirring. The precipitated resin was washed with ion exchange water, separated by filtration and dried in vacuum to obtain 14.8 g of white resin. The composition ratio by mol of this resin was confirmed to be 72/28 by the NMR measurement and the weight average molecular weight (polystyrene standard) was confirmed to be 12.300 by the GPC measured.

Resins of the present invention shown in Table 1 were synthesized in the same manner as above.

Examples of Resin (A):

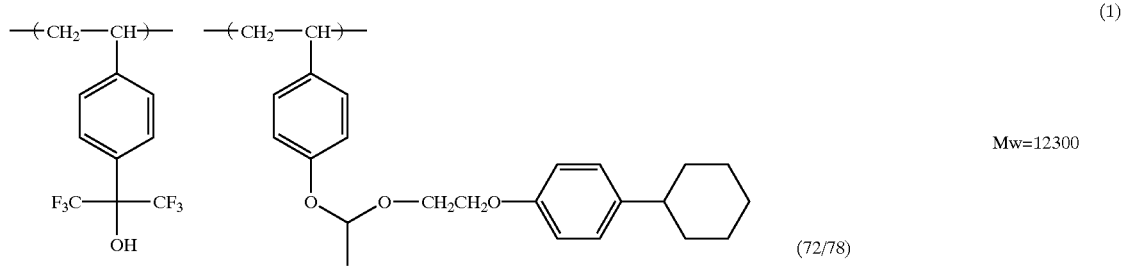

(1) Mw=12300 (72/78)

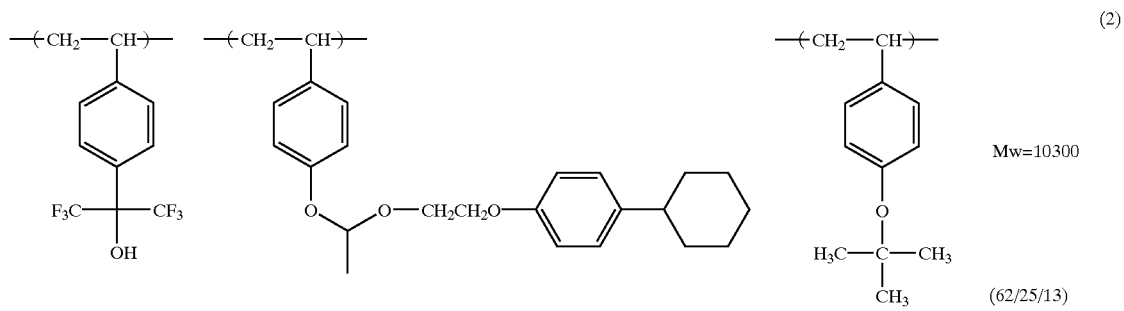

(2) Mw=10300 (62/25/13)

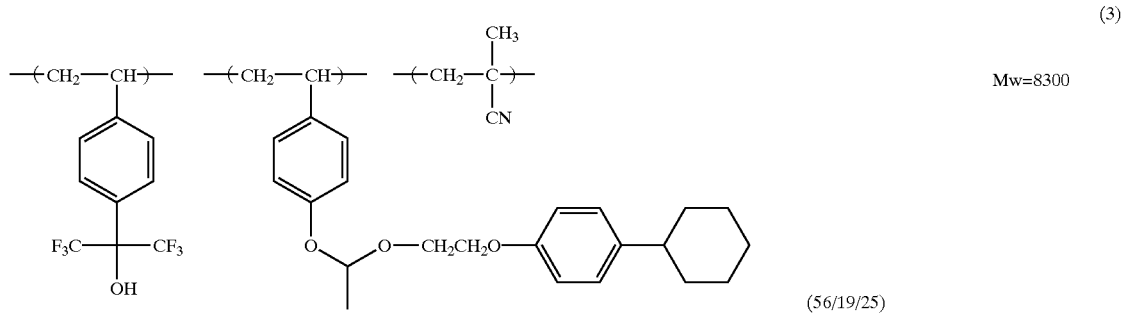

(3) Mw=8300 (56/19/25)

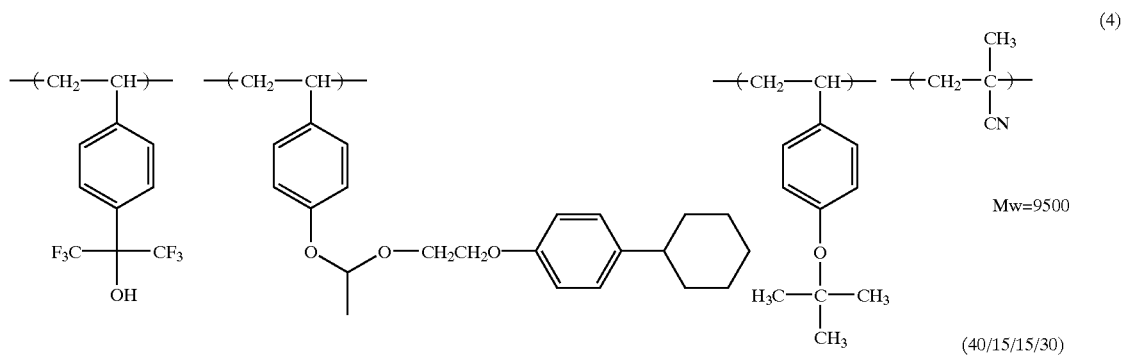

(4) Mw=9500 (40/15/15/30)

-continued
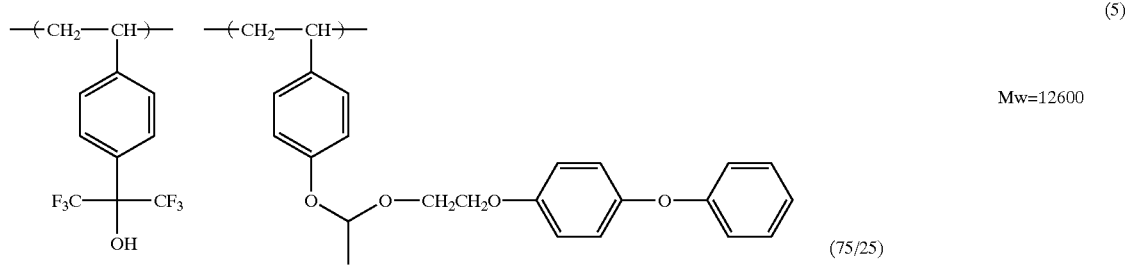
(5)
Mw=12600
(75/25)
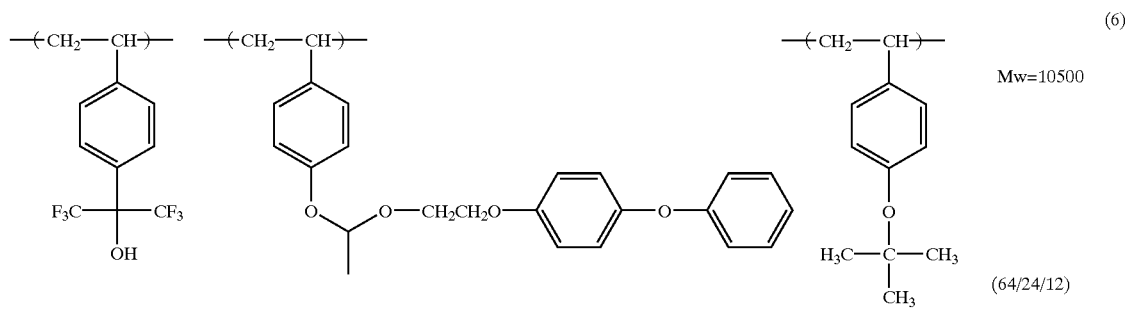
(6)
Mw=10500
(64/24/12)
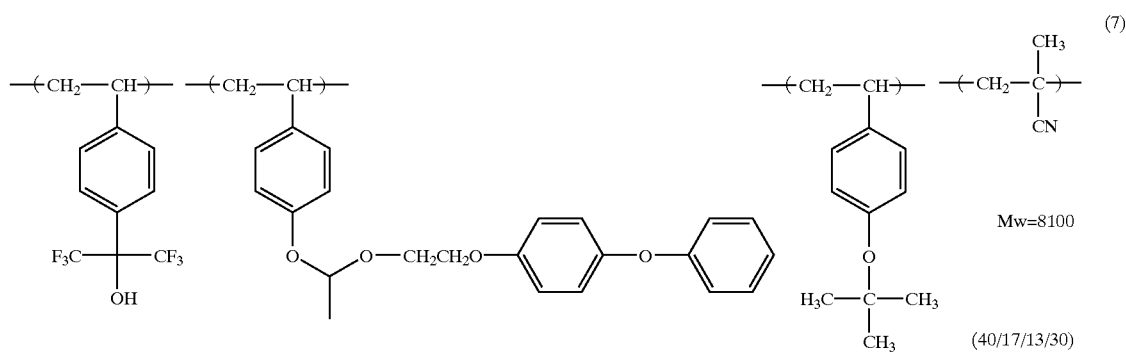
(7)
Mw=8100
(40/17/13/30)
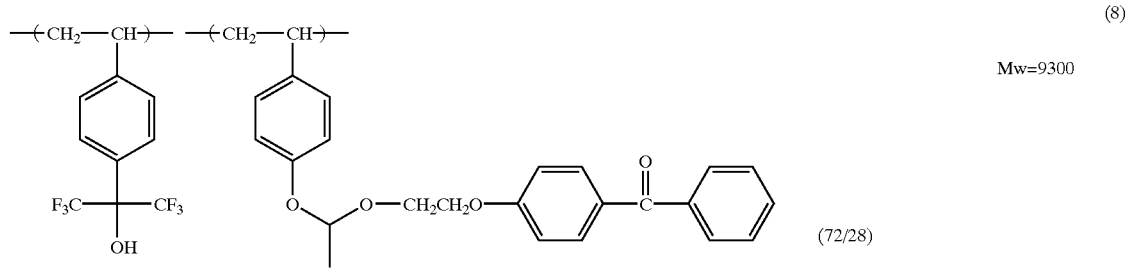
(8)
Mw=9300
(72/28)
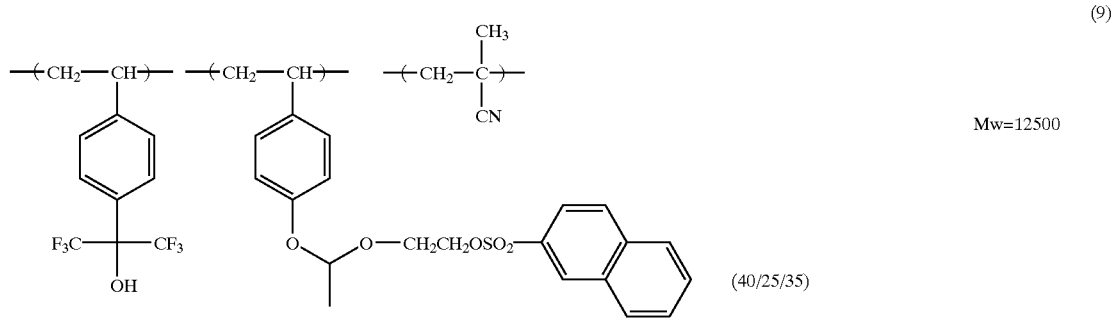
(9)
Mw=12500
(40/25/35)

-continued

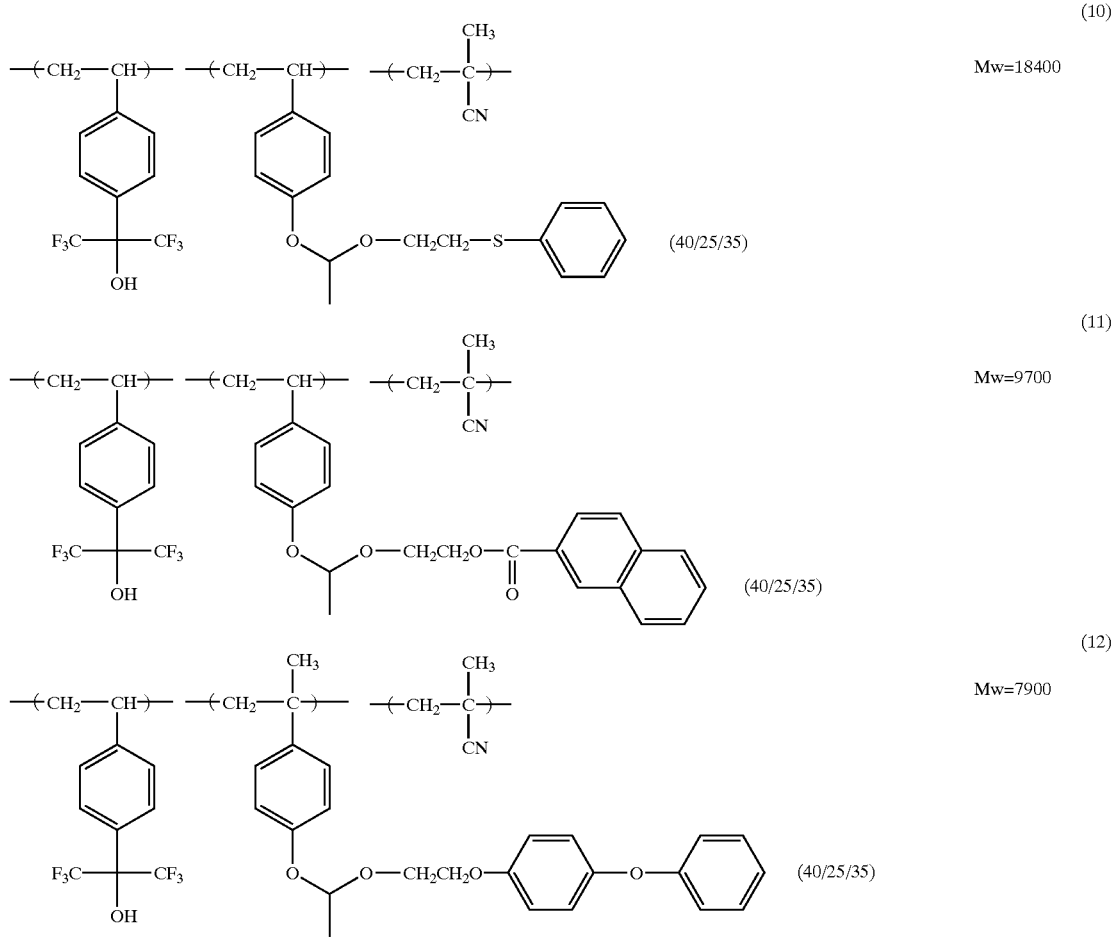

Example 1 and Comparative Example 1
Measurement of Transmittance:

From Resins (1) to (6) shown above, the resist compositions of the present invention were prepared by adding 0.02 g of triphenylsulfonium nonaflate salt (PAG4-3) and 0.02 g of imidosulfonate compound (PAG6-19) to 1.36 g of each resin, dissolving the mixture in 8.5 g of propylene glycol monomethyl ether acetate, and adding thereto 0.005 g of dicyclohexylmethylamine and 0.01 g of Megafac R08 (produced by Dainippon Ink & Chemicals Inc.) as a fluorine-containing surfactant. From Resins (7) to (12), the resist compositions of the present invention were prepared by adding 0.04 g of triphenylsulfonium nonaflate salt (PAG4-3) to 1.36 g of each resin, dissolving the mixture in 8.5 g of propylene glycol monomethyl ether acetate, and adding thereto 0.005 g of dicyclohexylmethylamine and 0.01 g of Megafac R08 (produced by Dainippon Ink & Chemicals Inc.) as a fluorine-containing surfactant.

In Comparative Example, a resist composition was prepared in the same manner as in Example 1 except for using poly[(4-hydroxystyrene)-(4-t-butoxycarbonyloxy-styrene)] (copolymerization compositional ratio: 65/35, weight average molecular weight: 15,000) in place of the resin of the present invention, and used for the formation of a comparative KrF resist.

Each sample solution was filtered through a 0.1-μm Teflon filter, coated on a calcium fluoride disk using a spin coater and dried under heating at 120° C. for 5 hours to obtain a resist film having a film thickness of 0.1 μm. The absorption of the coating film was measured by Acton CAMS-507 spectrometer and the transmittance at 157 nm was calculated. The results are shown in Table 1.

TABLE 1

| Resin | Transmittance at 157 nm (%) |
|---|---|
| (1) | 42 |
| (2) | 43 |
| (3) | 51 |
| (4) | 53 |
| (5) | 43 |
| (6) | 42 |
| (7) | 51 |
| (8) | 40 |
| (9) | 52 |
| (10) | 51 |
| (11) | 50 |
| (12) | 49 |
| Comparative Example 1 (acetal-base KrF resist) | 18 |

As seen from the results in Table 1, the measured transmittance of the coating film using the composition of the present invention is almost in excess of 50% and this reveals that the coating film has a sufficiently high transmittance at 157 nm.

Example 2

Evaluation of Coatability and Development Defect:

The resist compositions of the present invention were prepared by changing the surfactant used in Example 1 to the following W1 to W4. The surfactants used are shown below.

The surfactants used are:

W1: Megafac F176 (produced by Dainippon Ink & Chemicals Inc.) (containing fluorine)
W2: Megafac R08 (produced by Dainippon Ink & Chemicals Inc.) (containing fluorine and silicon)
W3: Polysiloxane polymer KP-341 (produced by Shin-Etsu Chemical Co., Ltd.
W4: Polyoxyethylene nonylphenyl ether Each sample solution was filtered through a 0.1-$\mu$m Teflon filter, coated on a silicon wafer treated with hexamethyldisilazane using a spin coater and dried under heating on a vacuum contact-type hot plate at 110° C. for 90 seconds to obtain resist films having a film thickness of 0.3 $\mu$m. The obtained resist films each was imagewise exposed using a KrF excimer stepper (FPA-3000EX5, manufactured by Canon), after-heated at 110° C. for 90 seconds and then developed with a 0.262N TMAH (tetramethylammonium hydroxide) aqueous solution to form a 0.5-$\mu$m L/S pattern.

The development defect and coatability were evaluated as follows.

[Number of Development Defects]

The resist pattern obtained above was measured on the number of development defects using a machine KLA-2112 manufactured by KLA Tenchol and the obtained primary data value was used as the number of development defects.

[Coatability (In-Plane Uniformity)]

Each resist solution was coated on a 8-inch silicon wafer and treated in the same manner as in the above-described formation of a resist layer to obtain a resist coating film for the measurement of in-plane uniformity. The film thickness of this coating film was measured using Lambda A manufactured by Dainippon Ink & Chemicals Inc. at 36 sites making a cross at equal intervals along the diameter direction of the wafer.

From the measured values, a standard deviation was determined. When the triple of the standard deviation is less than 50, the rating was ◯ and when 50 or more, the rating was X.

The results in the evaluation of performance are shown in Table 2.

TABLE 2

| Resin (A) of the Invention | Surfactant Used | Development Defects | Coatability |
|---|---|---|---|
| (1) | W1 | 20 | ◯ |
| (2) | W2 | 21 | ◯ |
| (3) | W3 | 22 | ◯ |
| (4) | W2 | 30 | ◯ |
| (5) | W2 | 19 | ◯ |
| (6) | W3 | 20 | ◯ |
| (7) | W1 | 25 | ◯ |
| (8) | W2 | 36 | ◯ |
| (9) | W3 | 38 | ◯ |
| (10) | W2 | 26 | ◯ |
| (11) | W1 | 35 | ◯ |
| (12) | W3 | 28 | ◯ |
| (1) | None | 2000 | X |
| (1) | W4 | 650 | X |

As seen from the results in Table 2, the composition of the present invention containing a fluorine- and/or silicon-containing surfactant has very excellent coatability and is greatly reduced in the development defects as compared with Comparative Example not containing the component.

Example 3 and Comparative Example 2

Evaluation of Image-Forming Property:

Using the resins of the present invention, resist solutions were prepared in the same manner as in Example 1. Each sample solution was filtered through a 0.1-$\mu$m Teflon filter, coated on a silicon wafer treated with hexamethyldisilazane using a spin coater and dried under heating on a vacuum contact-type hot plate at 110° C. for 90 seconds to obtain resist films having a film thickness of 0.1 $\mu$m. The obtained resist films each was measured on the dissolution contrast between the exposed area and the unexposed area upon exposure at 157 nm using a 157-nm laser exposure/dissolution behavior analyzer VUVES-4500 (manufactured by Lisotec Japan).

The results are shown in Table 3.

TABLE 3

| Resin of the Invention | Dissolution Contrast (tanθ) |
|---|---|
| (1) | 5.8 |
| (2) | 6.1 |
| (3) | 5.7 |
| (4) | 6.2 |
| (5) | 6.4 |
| (6) | 6.5 |
| (7) | 5.8 |
| (8) | 5.9 |
| (9) | 6.2 |
| (10) | 6.1 |
| (11) | 5.9 |
| (12) | 6.5 |
| Comparative Example 2 (acetal-base KrF resist) | 5.3*[1] |

*[1] A value at the exposure by KrF excimer laser (248 nm).

As seen from the results in Table 3, the composition of the present invention provides a dissolution contrast, namely, image-forming property equal to that provided by the resist of Comparative Example, which is practically used for KrF excimer.

According to the present invention, a positive resist composition exhibiting sufficiently high transmittance and image-forming property even with light at a short wavelength of 157 nm and improved in the problems of coatability and development defect ascribable to fluorine resin can be provided.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a resin containing at least one repeating unit represented by the following formula (I) and at least one repeating unit represented by formula (VII), which decomposes under the action of an acid to increase the solubility in an alkali developer, and (B) a compound capable of generating an acid upon irradiation with actinic rays or radiation:

(I)

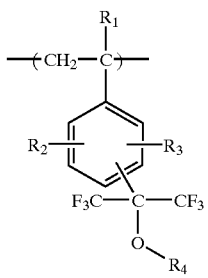

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; and $R_4$ represents a hydrogen atom, an alkyl group which may have a substituent, a perfluoroalkyl group which may have a substituent, a cycloalkyl group which may have a substituent, an acyl group which may have a substituent, an alkoxycarbonyl group which may have a substituent, an alkoxycarbonylmethyl group which may have a substituent, or a group represented by formula (II) which may have a substituent:

(II)

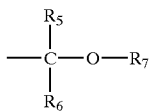

wherein $R_5$ and $R_6$, which may be the same or different, each represents a hydrogen atom, an alkyl group which may have a substituent, or a cycloalkyl group which may have a substituent; $R_7$ represents an alkyl group which may have a substituent, a perfluoroalkyl group which may have a substituent, a cycloalkyl group which may have a substituent, a perfluorocycloalkyl group which may have a substituent, an aralkyl group which may have a substituent, or an aryl group which may have a substituent; and two of $R_5$ to $R_7$ may combine to form a ring;

(VII)

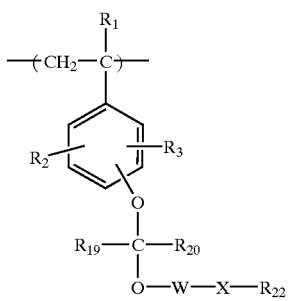

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; $R_{19}$ and $R_{20}$, which may be the same or different, each represents an alkyl group which may have a substituent, a monocyclic or polycyclic cycloalkyl group which may have a substituent, an alkenyl group which may have a substituent, an aralkyl group which may have a substituent, or an aryl group which may have a substituent; W represents a divalent linking group; X represents a single bond, an oxygen atom, a sulfur atom, a selenium atom, or a group selected from the group consisting of —CO—, —CO$_2$—, —OCO—, —SO— and —SO$_2$—; and $R_{22}$ represents a monovalent hydrocarbon group having from 1 to 30 carbon atoms, which may have a heteroatom.

2. The positive resist composition as claimed in claim 1, wherein the resin (A) further contains at least one repeating unit represented by the following formula (VI):

(VI)

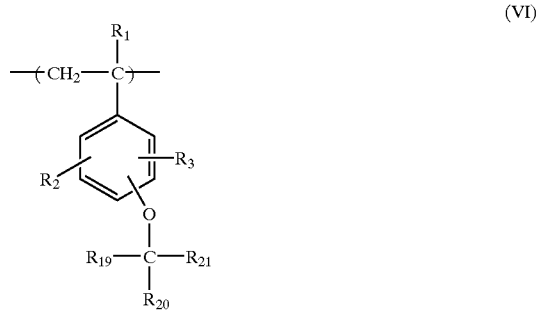

wherein $R_1$ represents a hydrogen atom, a halogen atom, a cyano group, an alkyl group which may have a substituent, or a haloalkyl group which may have a substituent; $R_2$ and $R_3$, which may be the same or different, each represents a hydrogen atom, a hydroxyl group, a halogen atom, a cyano group, an alkoxy group, an acyl group, an alkyl group which may have a substituent, a cycloalkyl group which may have a substituent, an alkenyl group which may have a substituent, an aralkyl group which may have a substituent, or an aryl group which may have a substituent; $R_{19}$ to $R_{21}$, which may be the same or different, each represents an alkyl group which may have a substituent, a monocyclic or polycyclic cycloalkyl group which may have a substituent, an alkenyl group which may have a substituent, an aralkyl group which may have a substituent, or an aryl group which may have a substituent; and two of $R_{19}$ to $R_{21}$ may combine to form a ring.

3. The positive resist composition as claimed in claim 1, wherein the resin (A) further contains at least one repeating unit represented by the following formula (III):

(III)

wherein $R_8$ and $R_9$, which may be the same or different, each represents a hydrogen atom, a halogen atom, a cyano group, an alkyl group which may have a substituent, or a haloalkyl group which may have a substituent; $R_{10}$ represents a hydrogen atom, a halogen atom, an alkyl group which may have a substituent, a haloalkyl group which may have a substituent, or a —$A_1$—CN group; $A_1$ represents a single bond, a divalent alkylene group which may have a substituent, an alkenylene group which may have a substituent, a cycloalkylene group which may have a substituent, an arylene group which may have a substituent, —O—CO—$R_{11}$—, —CO—O—$R_{12}$— or —CO—N($R_{13}$)—$R_{14}$—; $R_{11}$, $R_{12}$ and $R_{14}$, which may be the same or different, each represents a single bond, a divalent alkylene group which may have an ether group, an ester group, an amido group, a urethane group or a ureido group, an alkenylene group which may have an ether group, an ester group, an amido group, a urethane group or a ureido group, a cycloalkylene group which may have an ether group, an ester group, an amido group, a urethane group or a ureido group, or an arylene group which may have an ether group, an ester group, an amido group, a urethane group or a ureido group; and $R_{13}$ represents a hydrogen atom, an alkyl group which may have a substituent, a cycloalkyl group which may have a substituent, an aralkyl group which may have a substituent, or an aryl group which may have a substituent.

4. The positive resist composition as claimed in claim 1, which further contains (C) a compound having a basic nitrogen atom as the acid diffusion inhibitor.

5. The positive resist composition as claimed in claim 1, wherein the compound as the component (B) is selected from sulfonium salt or iodonium salt compounds capable of generating a perfluoroalkylsulfonic acid having 2 or more carbon atoms, a perfluoroarylsulfonic acid or an arylsulfonic acid substituted by a perfluoroalkyl group upon irradiation with actinic rays or radiation.

6. The positive resist composition as claimed in claim 1, wherein the compound as the component (B) is selected from an imido-N-sulfonate compound, an oxime-N-sulfonate compound or a disulfone compound.

7. The positive resist composition as claimed in claim 1, wherein the compound as the component (B) comprises sulfonium salt or iodonium salt compounds capable of generating a perfluoroalkylsulfonic acid having 2 or more carbon atoms, a perfluoroarylsulfonic acid or an arylsulfonic acid substituted by a perfluoroalkyl group; and an imido-N-sulfonate compound, an oxime-N-sulfonate compound or a disulfone compound.

8. The positive resist composition as claimed in claim 5, wherein the sulfonium salt is a compound generating a nanofluorobutanesulfonic acid.

9. The positive resist composition as claimed in claim 1, wherein the $R_4$ in formula (I) is a hydrogen atom.

10. The positive resist composition as claimed in claim 1, wherein the content of the repeating units represented by formulae (I) is from 40 to 80 mol % in the entire polymer composition.

11. The positive resist composition as claimed in claim 1, wherein the content of the repeating units represented by formulae (VII) is from 15 to 30 mol % in the entire polymer composition.

12. The positive resist composition as claimed in claim 1, wherein the total content of the repeating units represented by formulae (I) and (VII) is from 20 to 100 mol % in the entire polymer composition.

13. The positive resist composition as claimed in claim 1, which further contains (D) a fluorine-containing surfactant and/or a silicon-containing surfactant.

14. The positive resist composition as claimed in claim 1, wherein vacuum ultraviolet light of 160 nm or less is used as an exposure light source.

15. The positive resist composition as claimed in claim 1, wherein the resin (A) is added in an amount of from 5 to 99.5 wt % based on all solid components in the composition.

16. The positive resist composition as claimed in claim 1, wherein the resin (A) has a weight average molecular weight of from 1,000 to 200,000 and a molecular weight distribution of from 1 to 10.

* * * * *